United States Patent
Kittl et al.

(10) Patent No.: US 9,431,492 B2
(45) Date of Patent: Aug. 30, 2016

(54) INTEGRATED CIRCUIT DEVICES INCLUDING CONTACTS AND METHODS OF FORMING THE SAME

(71) Applicant: Samsung Electronics Co., Ltd., Suwon-si (KR)

(72) Inventors: Jorge A. Kittl, Round Rock, TX (US); Dharmendar Reddy Palle, Pflugerville, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/628,541

(22) Filed: Feb. 23, 2015

(65) Prior Publication Data

US 2015/0243747 A1   Aug. 27, 2015

Related U.S. Application Data

(60) Provisional application No. 61/942,814, filed on Feb. 21, 2014.

(51) Int. Cl.
| | |
|---|---|
| *H01L 29/45* | (2006.01) |
| *H01L 29/417* | (2006.01) |
| *H01L 27/088* | (2006.01) |
| *H01L 29/78* | (2006.01) |
| *H01L 27/12* | (2006.01) |
| *H01L 21/768* | (2006.01) |
| *H01L 23/485* | (2006.01) |

(52) U.S. Cl.
CPC ... *H01L 29/41791* (2013.01); *H01L 21/76897* (2013.01); *H01L 23/485* (2013.01); *H01L 27/0886* (2013.01); *H01L 27/1211* (2013.01); *H01L 29/45* (2013.01); *H01L 29/7851* (2013.01); *H01L 29/7848* (2013.01); *H01L 2924/0002* (2013.01)

(58) Field of Classification Search
None
See application file for complete search history.

(56) References Cited

U.S. PATENT DOCUMENTS

| | | |
|---|---|---|
| 7,678,652 B2 | 3/2010 | Tsuchiaki |
| 7,763,943 B2 | 7/2010 | Pillarisetty et al. |

(Continued)

FOREIGN PATENT DOCUMENTS

| | | |
|---|---|---|
| KR | 10-2013-0100362 A | 9/2013 |
| WO | WO 2013/101219 | 7/2013 |

OTHER PUBLICATIONS

International Search Report and Written Opinion Corresponding to International Application No. PCT/US2015/017111; Date of Mailing: May 29, 2015; 13 Pages.

*Primary Examiner* — Alexander Ghyka
(74) *Attorney, Agent, or Firm* — Myers Bigel & Sibley, P.A.

(57) ABSTRACT

Integrated circuit devices including contacts and methods of forming the same are provided. The devices may include a fin on a substrate, a gate structure on the fin and a source/drain region in the fin at a side of the gate structure. The devices may further include a contact plug covering an uppermost surface of the source/drain region and a sidewall of the gate structure. The contact plug may include an inner portion including a first material and an outer portion including a second material different from the first material. The outer portion may at least partially cover a sidewall of the inner portion, and a portion of the outer portion may be disposed between the sidewall of the gate structure and the sidewall of the inner portion.

20 Claims, 29 Drawing Sheets

(56) References Cited

U.S. PATENT DOCUMENTS

| | | |
|---|---|---|
| 7,977,182 B2 | 7/2011 | Nishi et al. |
| 8,592,916 B2 | 11/2013 | Khakifirooz et al. |
| 2008/0099850 A1 | 5/2008 | Jeon et al. |
| 2012/0153387 A1 | 6/2012 | Murthy |
| 2012/0161321 A1 | 6/2012 | Haverty et al. |
| 2012/0168877 A1 | 7/2012 | Mukherjee et al. |
| 2013/0154016 A1 | 6/2013 | Glass et al. |
| 2013/0241007 A1 | 9/2013 | Choi et al. |
| 2013/0277752 A1 | 10/2013 | Glass et al. |
| 2013/0285155 A1 | 10/2013 | Glass et al. |
| 2013/0307032 A1 | 11/2013 | Kamineni et al. |
| 2014/0001520 A1 | 1/2014 | Glass et al. |

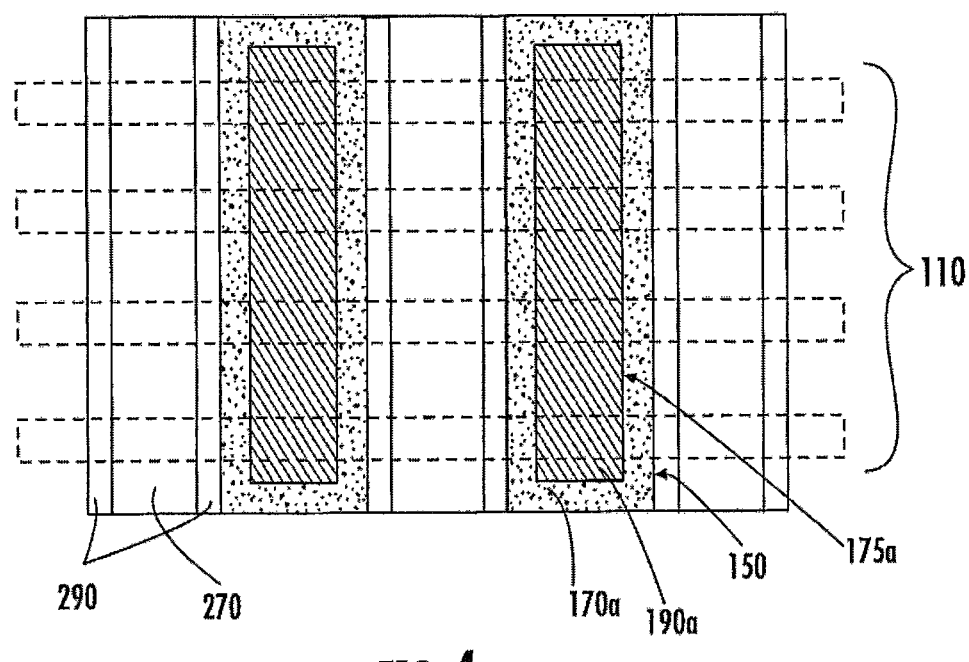
FIG. 4
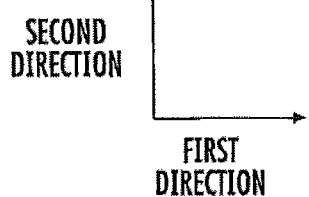

INTEGRATED CIRCUIT DEVICES INCLUDING CONTACTS AND METHODS OF FORMING THE SAME

CROSS-REFERENCE TO RELATED APPLICATION

This application claims priority of U.S. Provisional Application Ser. No. 61/942,814, entitled THREE DIMENSIONAL AREA ENHANCED CONTACTS TO SEMICONDUCTOR, filed in the USPTO on Feb. 21, 2014, the disclosure of which is hereby incorporated by reference herein in its entirety.

FIELD

The present disclosure generally relates to the field of electronics and, more particularly, to integrated circuit devices.

BACKGROUND

Contact structures connected to source/drain regions may include metal to reduce resistances of the contact structures. The source/drain regions may include semiconductor material and a parasitic resistance originated from an interface between the metal and the semiconductor material may thus exist. The parasitic resistance may increase resistances of the contact structures.

SUMMARY

An integrated circuit device may include a fin on a substrate, first and second gate structures on the fin and a source/drain region in the fin between the first and second gate structures. Sidewalls of the first and second gate structures may define a recess therebetween. The device may also include a contact plug on the source/drain region and in the recess. The contact plug may include an inner portion including a first material and an outer portion including a second material different from the first material. The outer portion may at least partially cover a sidewall of the inner portion, and a portion of the outer portion may be disposed between the sidewall of the first gate structure and the sidewall of the inner portion.

In various embodiments, the inner portion and the outer portion may have a specific interface resistivity less than about 1e−8 $\Omega$-cm$^2$.

In various embodiments, a first one of the first material and the second material may be a semiconductor material including Si, SiGe, InGaAs, InAs, Ge, InSb, GaSb, InGaSb, III-V semiconductor material or II-VI semiconductor material, or combinations thereof. A second one of the first material and the second material may be a metal including Ni, Ti, Ta, TaN, TiN, TiC, W, TiAl, Ru, Al, La, Co, Pt, Pd, Mo or alloys thereof.

According to various embodiments, the outer portion may contact the inner portion.

According to various embodiments, the device may further include an insulating layer between the outer portion and the inner portion. In various embodiments, the insulating layer may include titanium oxide or zirconium oxide.

In various embodiments, the outer portion may include a semiconductor material, and the inner portion may include a metal. According to various embodiments, the device may further include a channel region in the fin. The first gate structure may overlie the channel region, and a lowermost surface of the inner portion may be higher than an uppermost surface of the channel region. A lower portion of the inner portion may protrude into the source/drain region such that a lowermost surface of the inner portion may be lower than an uppermost surface of the fin. The inner portion may cover an uppermost surface of the outer portion.

In various embodiments, the outer portion may include a metal, and the inner portion may include a semiconductor material. According to various embodiments, the outer portion may cover an uppermost surface of the inner portion.

According to various embodiments, the sidewall of the inner portion may include first opposing sidewalls of the inner portion that extend substantially parallel to the sidewall of the first gate structure, and the outer portion may cover the first opposing sidewalls of the inner portion.

In various embodiments, the outer portion may cover a second sidewall of the inner portion disposed between the first opposing sidewalls of the inner portion.

In various embodiments, the outer portion may surround the inner portion when viewed in a plan view.

According to various embodiments, the first and second gate structures may extend in a first direction, and the inner portion may have a length along the first direction greater than a width along a second direction that may be substantially perpendicular to the first direction.

In various embodiments, the first and second gate structures may have line shapes extending in a first direction, and the inner portion may include a plurality of inner portions disposed between the first and second gate structures and spaced apart from each other along the first direction. The outer portion may be disposed between sidewalls of two immediately adjacent ones of the plurality of inner portions.

According to various embodiments, the outer portion may extend in the first direction and may cover sidewalls of at least two of the plurality of inner portions facing the sidewall of the first gate structure.

In various embodiments, the first and second gate structures may have line shapes extending in a first direction. The outer portion may include a plurality of outer portions disposed between the first and second gate structures and spaced apart from each other along the first direction, and the plurality of inner portions may be at least partially in the respective plurality of outer portions.

In various embodiments, one of the outer and inner portions may include a semiconductor material, and a distance between an uppermost surface of the fin and an uppermost surface of the one of the outer and inner portions may be at least about 50% of a distance between the uppermost surface of the fin and an uppermost surface of the first gate structure.

A method of forming an integrated circuit device may include forming a fin on a substrate, forming first and second gate structures on the fin and forming a source/drain region in the fin between the first and second gate structures. Sidewalls of the first and second gate structures may define a recess therebetween. The method may also include forming a contact plug on the source/drain region and in the recess. The contact plug may include an inner portion including a first material and an outer portion including a second material different from the first material. The outer portion may at least partially cover a sidewall of the inner portion, and a portion of the outer portion may be disposed between the sidewall of the first gate structure and the sidewall of the inner portion.

In various embodiments, the inner portion and the outer portion may have a specific interface resistivity less than about 1e−8 $\Omega$-cm$^2$.

In various embodiments, a first one of the first material and the second material may be a semiconductor material including Si, SiGe, InGaAs, InAs, Ge, InSb, GaSb, InGaSb, III-V semiconductor material or II-VI semiconductor material, or combinations thereof. A second one of the first material and the second material may be a metal including Ni, Ti, Ta, TaN, TiN, TiC, W, TiAl, Ru, Al, La, Co, Pt, Pd, Mo or alloys thereof.

According to various embodiments, forming the contact plug may include forming the contact plug including the outer portion contacting the inner portion.

According to various embodiments, forming the contact plug may include forming an insulating layer between the outer portion and the inner portion.

In various embodiments, forming the insulating layer may include forming the insulating layer including titanium oxide or zirconium oxide.

In various embodiments, the method may further include forming an interlayer insulating layer on the fin and in the recess prior to forming the contact plug, and removing a portion of the interlayer insulating layer to expose the recess.

According to various embodiments, the recess may include a first recess, and forming the contact plug may include forming a semiconductor layer in the first recess, removing a middle portion of the semiconductor layer to form the outer portion including the semiconductor layer. The outer portion may include a second recess therein. Forming the contact plug may also include forming the inner portion including a metal in the second recess.

In various embodiments, the method may further include forming a channel region in the fin. The first gate structure may overlie the channel region, and a lowermost surface of the inner portion may be higher than an uppermost surface of the channel region.

According to various embodiments, forming the contact plug may include forming the outer portion including a metal, and forming the inner portion including a semiconductor material.

In various embodiments, the recess may include a first recess. Forming the outer portion and the inner portion may include forming a sacrificial layer on sidewalls of the first recess that may include a second recess therein, forming the inner portion in the second recess, removing the sacrificial layer thereby forming gaps between the sidewalls of the first recess and the inner portion and forming the outer portion in the gaps.

In various embodiments, the recess may include a first recess. Forming the contact plug may include forming the outer portion on sidewalls of the first recess and forming the inner portion in the second recess. The outer portion may include a second recess therein.

According to various embodiments, forming the outer portion and the inner portion may include forming a protective layer overlying the source/drain region prior to forming the outer portion, forming the outer portion on the sidewalls of the first recess and the protective layer, removing the protective layer such that a cavity may be formed between the outer portion and the source/drain region and forming the inner portion in the second recess and the cavity.

In various embodiments, one of the outer and inner portions may include a semiconductor material, and a distance between an uppermost surface of the fin and an uppermost surface of the one of the outer and inner portions may be at least about 50% of a distance between the uppermost surface of the fin and an uppermost surface of the first gate structure.

BRIEF DESCRIPTION OF THE DRAWINGS

FIGS. 4 through 8 illustrate plan views, taken along the line B-B' of FIG. 2, illustrating an integrated circuit device according to some embodiments of the present inventive concept.

DETAILED DESCRIPTION

Figure 1:
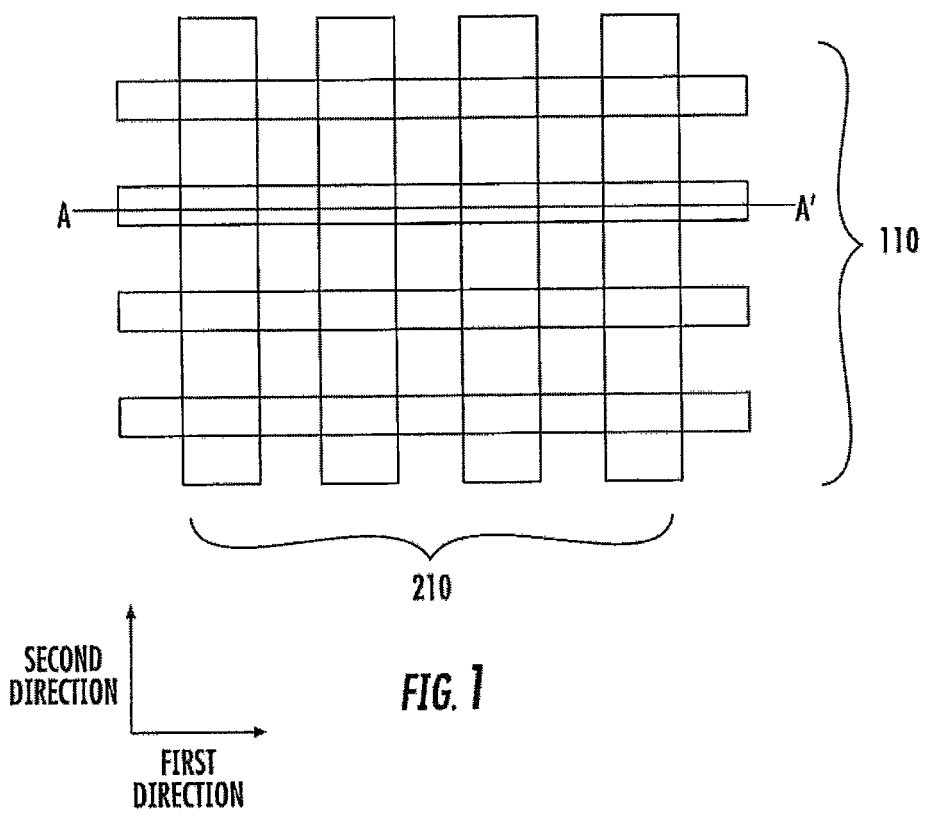
FIG. 1 is a plan view illustrating an integrated circuit device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof.

It will be understood that when an element is referred to as being "coupled," "connected" or "responsive" to or "on" another element, it can be directly coupled, connected or responsive to or on the other element, or intervening elements may also be present. In contrast, when an element is referred to as being "directly coupled," "directly connected" or "directly responsive" to or "directly on" another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein may be interpreted accordingly.

As appreciated by the present inventors, low power device designs are becoming increasingly important as process nodes move to smaller size scales. In Field Effect Transistor (FET) design, for example, FET performance may be adversely affected by a parasitic resistance originating from an interface between metal and semiconductor material in a contact plug connected to a source/drain region. This parasitic resistance becomes a larger component of total linear resistance experienced by a FET as devices scale smaller and may become a dominant component in the total resistance of device as the devices are scaled down past a certain point. The metal-semiconductor resistance is defined as a ratio of a specific interface resistivity $\rho_r$ in units of ohm-cm$^2$ to a metal and semiconductor interface area in a unit of cm$^2$. In some embodiments of the present inventive concept, a FET may be designed to have a specific interface resistivity $\rho_r$ less than about 1e–8 $\Omega$-cm$^2$. It will be understood that the interface area between the metal and semiconductor may decrease as process node size decreases. In order to mitigate adverse effects associated with scale down of device size, a specific interface resistivity of the metal-semiconductor interface may be reduced or possibly minimized without increasing a footprint of the contact as a whole. However, as appreciated by the present inventors, intrinsic limits related to material properties make it difficult to continually lower $\rho_r$ values. Accordingly, an alternative approach to minimize the metal-semiconductor resistance is desired to mitigate adverse effects of further scale down of FET devices and their associated circuits. Integrated circuit devices according to various embodiments of the present inventive concept may include a contact plug that has an increased interface area between metal and semiconductor material to reduce a parasitic resistance of the contact plug while not increasing a footprint of the contact plug.

Further FET devices according to some embodiments of the present inventive concept may include a metal layer, which is in a contact plug connected to a source/drain region and is located substantially above the channel region. Accordingly, the FET devices may be manufactured through processes compatible with various source and drain refill schemes which may be used, for example, for strain engineering and other purposes.

FIG. 1 is a plan view illustrating an integrated circuit device according to some embodiments of the present inventive concept. According to FIG. 1, an integrated circuit device may include a substrate 100 and fins 110 disposed on the substrate 100. Each of the fins 110 may protrude from the substrate 100 and may extend in a first direction. For example, the fins 110 may have a line shape, as illustrated in FIG. 1.

The substrate 100 may include one or more semiconductor materials, for example, Si, Ge, SiGe, GaP, GaAs, SiC, SiGeC or InP. In some embodiments, the substrate 100 may be a bulk silicon substrate or a semiconductor on insulator (SOI) substrate. The fins 110 may include Si, Ge, SiGe, GaP, GaAs, InAs, InGaAs, InGaSb, GaSb, InSb, SiC, SiGeC, InP or a combination thereof.

The integrated circuit device may also include gate structures 210 that extend in a second direction that is different from the first direction such that the gate structures 210 cross the fins 110. The fins 110 may be disposed between the substrate 100 and the gate structures 210. For example, the second direction may be substantially perpendicular to the first direction. It will be understood that widths of the fins 110 may not be uniform as illustrated in FIG. 1. In some embodiments, portions of the fins 110 exposed by the gate structures 210 may be partially removed (e.g., etched) and re-grown using an epitaxial growth process. Re-grown portions of the fins 110 may have widths greater than widths of the fins 110 as originally formed. The re-grown portions of the fins 110 may include a stress material that has a lattice constant different from a lattice constant of a material included in the fins 110 and thereby inducing stress on portions of the fins 110 covered by the gate structures 210.

Figure 2:
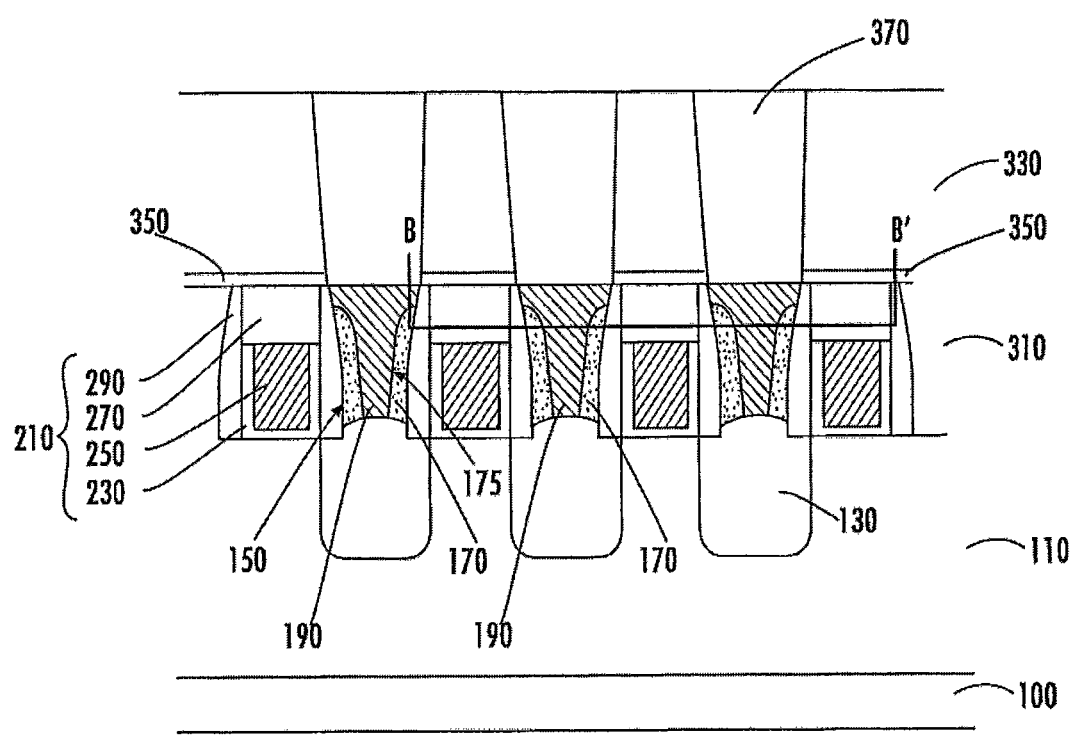
FIG. 2 is a cross-sectional view, taken along the line A-A' of FIG. 1, illustrating an integrated circuit device according to some embodiments of the present inventive concept.

FIG. 2 is a cross-sectional view, taken along the line A-A' of FIG. 1, illustrating an integrated circuit device according to some embodiments of the present inventive concept. It will be understood that FIG. 1 only shows the fins 110 and the gate structures 210 for ease of description. Referring to FIG. 2, the integrated circuit device may include source/drain regions 130 in the fin 110 between the gate structures 210. The source/drain regions 130 may be portions of the fin 110 such that the source/drain regions 130 may include materials included in the fin 110. In some embodiments, the source/drain regions 130 may include materials different from the fin 110. For example, the source/drain regions 130 may be formed using an epitaxial growth process using the fin 110 as a seed layer.

Each of the gate structures 210 may include a gate insulation layer 230, a gate electrode 250 and a gate capping pattern 270, which are sequentially stacked on the fin 110 and a gate spacer 290 on a sidewall of the gate electrode 250. The gate insulation layer 230 may include, for example, an interface layer, high k material or a combination thereof. In some embodiments, the interface layer may include silicon oxide. The gate insulation layer 230 may be a single layer or a multilayer stack. The gate electrode 250 may include, for example, semiconductor material, metal or a combination thereof. For example, the gate electrode 250 may be a multilayer stack including a diffusion barrier layer and/or a work function control layer. The gate spacers 290 directly adjacent each other may define first recesses 150 on the source/drain regions 130. The gate spacer 290 may include, for example, nitride and, in some embodiments, may include more than one layer.

Semiconductor patterns 170 may be disposed in the first recesses 150 and on the source/drain regions 130. The semiconductor patterns 170 may contact uppermost surfaces of the source/drain regions 130 and may expose central portions of the source/drain regions 130. In some embodiments, the semiconductor patterns 170 and the source/drain regions 130 may include the same material and boundaries there between may thus be less visible. The semiconductor patterns 170 may have a substantially uniform thickness along sidewalls of the first recesses 150 and may define second recesses 175. Thicknesses of the semiconductor patterns 170 may be in a range of about 2 nm to about 20 nm.

Metal patterns 190 may be disposed in the second recesses 175 such that portions of the semiconductor patterns 170 may be disposed between sidewalls of the gate structures 210 and sidewalls of the metal patterns 190. Stated in other words, the metal patterns 190 may cover sidewalls of the semiconductor patterns 170. Upper portions of the metal patterns 190 may be in the first recesses 150, and the metal patterns 190 may at least partially cover uppermost surfaces of the semiconductor patterns 170. In some embodiments, the metal patterns 190 may fill upper portions of the first recesses 150. The metal patterns 190 may contact the semiconductor patterns 170.

It will be understood that inner sidewalls of the semiconductor patterns 170 may constitute interfaces between the semiconductor patterns 170 and the metal patterns 190. Accordingly, interface areas between the semiconductor patterns 170 and the metal patterns 190 may increase as heights of the semiconductor patterns 170 relative to an upper surface of the fin 110 increase. In some embodiments, a vertical distance between the upper surface of the fin 110 and an uppermost surface of the semiconductor pattern 170 may be at least about 50% of a vertical distance between the upper surface of the fin 110 and an uppermost surface of the gate structure 210. It will be further understood that "a vertical distance" may refer a distance in a direction in which the fin 110 protrudes from the substrate 100.

The semiconductor patterns 170 may include, for example, Si, SiGe, InGaAs, InAs, Ge, InSb, GaSb, InGaSb, III-V semiconductor material or II-VI semiconductor material, or a combination thereof. When the semiconductor patterns 170 include an alloy of semiconductor materials, a composition of the alloy may vary through the semiconductor patterns 170. In some embodiments, the semiconductor patterns 170 may include InGaAs having a varying content of Ga. The semiconductor pattern 170 may include a doped semiconductor material to further reduce resistance. In some embodiments, the semiconductor pattern 170 may include a highly doped material.

The metal pattern 190 may include, for example, Ni, Ti, Ta, TaN, TiN, TiC, W, TiAl, Ru, Al, La, Co, Pt, Pd, Mo or alloys thereof, including alloys with the semiconductor materials present in 170. The metal pattern 190 may be a bi-layer or a nanolaminate of metallic films. It will be understood that Schottky barrier height may be considered in choosing the material included in the metal pattern 190 to reduce or possibly minimize contact resistance. It will be further understood that the semiconductor pattern 170 and the metal pattern 190 may constitute a contact plug.

In some embodiments, insulation patterns may be disposed between the semiconductor patterns 170 and the metal patterns 190 to form metal-insulator-semiconductor (MIS) contacts there between. The MIS contacts may further reduce contact resistance between the semiconductor patterns 170 and the metal patterns 190. The insulation patterns may include, for example, TiOx or ZnO and may have a thickness about 1 nm. According to some embodiments, a portion of the metal pattern 190 contacting the semiconductor pattern 170 may react to form a silicide layer when the semiconductor pattern 170 includes silicon. In some embodiments, a portion of the metal pattern 190 contacting the semiconductor pattern 170 may react to form a metal-semiconductor compound layer.

Still referring to FIG. 2, a first interlayer insulation layer 310 and a second interlayer insulation layer 330 may be sequentially disposed on the fin 110. The first and second interlayer insulation layers 310 and 330 may include, for example, silicon oxide or low-k material. Protective layer patterns 350 may be disposed between the first and second interlayer insulation layers 310 and 330 and may expose upper surfaces of the metal patterns 190. The protective layer patterns 350 may protect the first interlayer insulation layer 310 during subsequent processes. For example, the protective layer patterns 350 may include nitride. Contact structures 370 may be disposed in the second interlayer insulation layer 330 and may contact the metal patterns 190. The contact structures 370 may include conductive material, for example, metal, such as W, Cu and Al.

Figure 3:
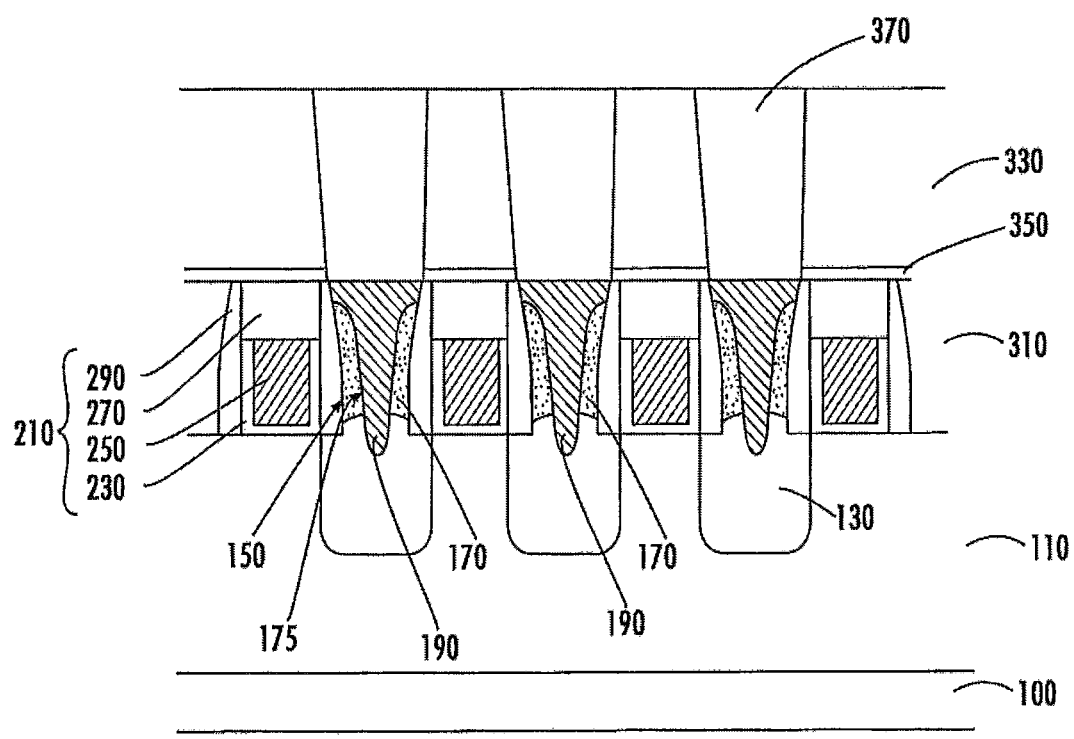
FIG. 3 is a cross-sectional view, taken along the line A-A' of FIG. 1, illustrating an integrated circuit device according to some embodiments of the present inventive concept.

FIG. 3 is a cross-sectional view, taken along the line A-A' of FIG. 1, illustrating an integrated circuit device according to some embodiments of the present inventive concept. According to FIG. 3, the metal patterns 190 may recess into the source/drain regions 130, and lowermost surfaces of the metal patterns 190 may be lower than an upper surface of the fin 110 relative to an upper surface of the substrate 100.

FIGS. 4 through 8 illustrate plan views, taken along the line B-B' of FIG. 2, illustrating an integrated circuit device according to some embodiments of the present inventive concept.

According to FIG. 4, sidewalls of gate spacers 290 may define first recesses 150 having a line shape extending in a second direction. Semiconductor patterns 170a may be disposed in the first recesses 150 and may define second recesses 175a therein. The second recesses 175a may extend in the second direction. The semiconductor patterns 170a may cross several fins 110. Metal patterns 190a may be disposed in the second recess 175a and may have a line shape extending in the second direction. The metal pattern 190a may have a length in the second direction greater than a width in a first direction. In some embodiments, the metal patterns 190a may fill the second recesses 175a. The semiconductor patterns 170a may surround the metal patterns 190a, and according to some embodiments, the semiconductor patterns 170a may completely enclose the metal patterns 190a, as illustrated in FIG. 4.

Still referring to FIG. 4, each of the metal patterns 190a may have first opposing sidewalls extending in the second direction (i.e., the longer sides of the metal patterns 190a) and a second sidewall that is disposed between the first opposing sidewalls (i.e. the shorter side of the metal patterns 190a). The semiconductor patterns 170a may cover both the first opposing sidewalls and the second sidewall.

Figure 5:
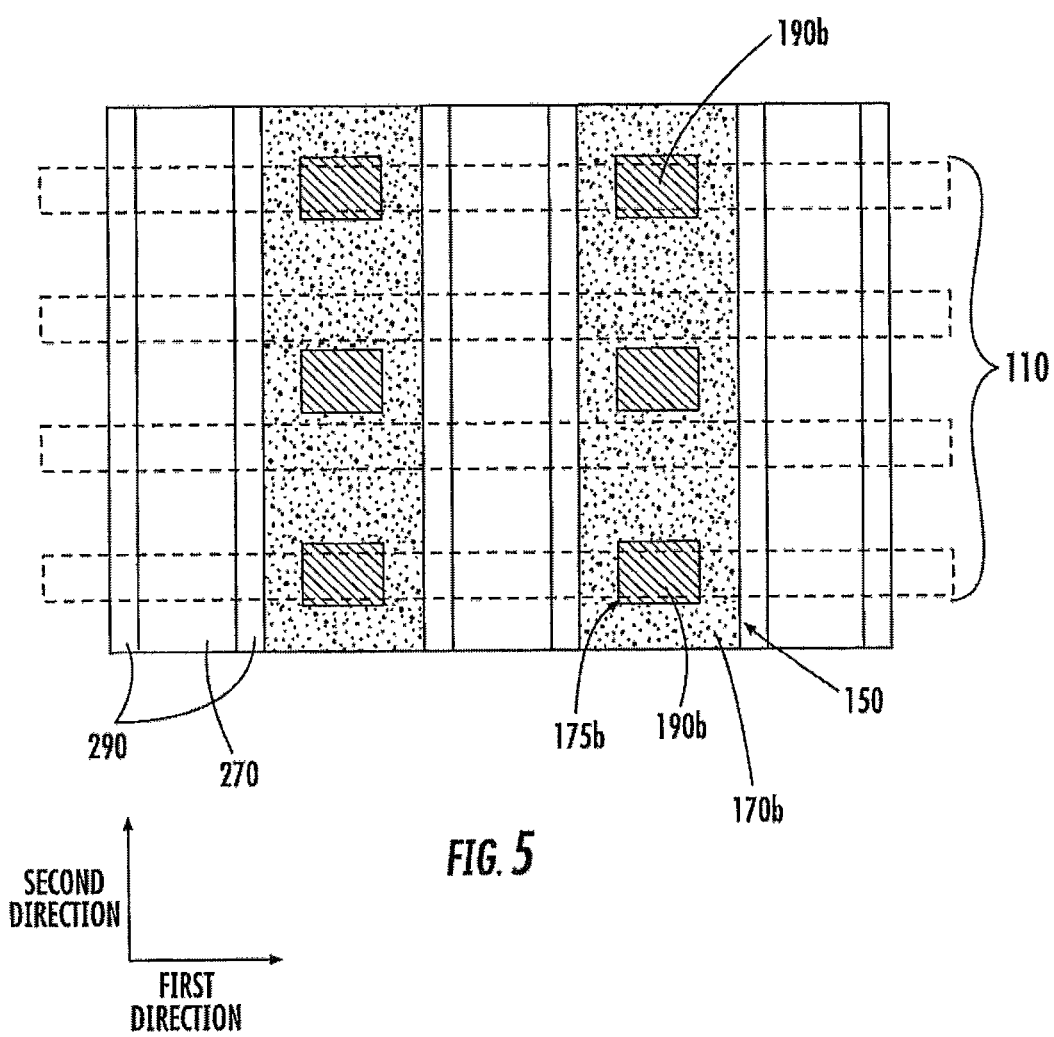

Referring to FIG. 5, each of semiconductor patterns 170b may define second recesses 175b. In some embodiments, each of the second recesses 175b may have a rectangular shape as illustrated in FIG. 5 but each of the second recesses 175b may have different shapes such as, for example, a circle shape. Metal patterns 190b may be disposed in the respective second recesses 175b. The semiconductor patterns 170b may surround the metal patterns 190b and may fill spaces between the metal patterns 190b. For example, the semiconductor patterns 170b may completely enclose the metal patterns 190b, as illustrated in FIG. 5. In some embodiments, some of the metal patterns 190b may overlie fins 110 and some of the metal patterns 190b may not overlie fins 110, as illustrated in FIG. 5.

Still referring to FIG. 5, more than one metal pattern 190b may be disposed in one of the semiconductor patterns 170b, and portions of one of the semiconductor patterns 170b may thus be disposed between two immediately adjacent ones of the metal patterns 190b. Each of the metal patterns 190b may have a first sidewall extending in the first direction and a second sidewall extending in the second direction. Accordingly, portions of the semiconductor patterns 170b may be disposed between the second sidewalls of two immediately adjacent the metal patterns 190b as illustrated in FIG. 5.

Figure 6:
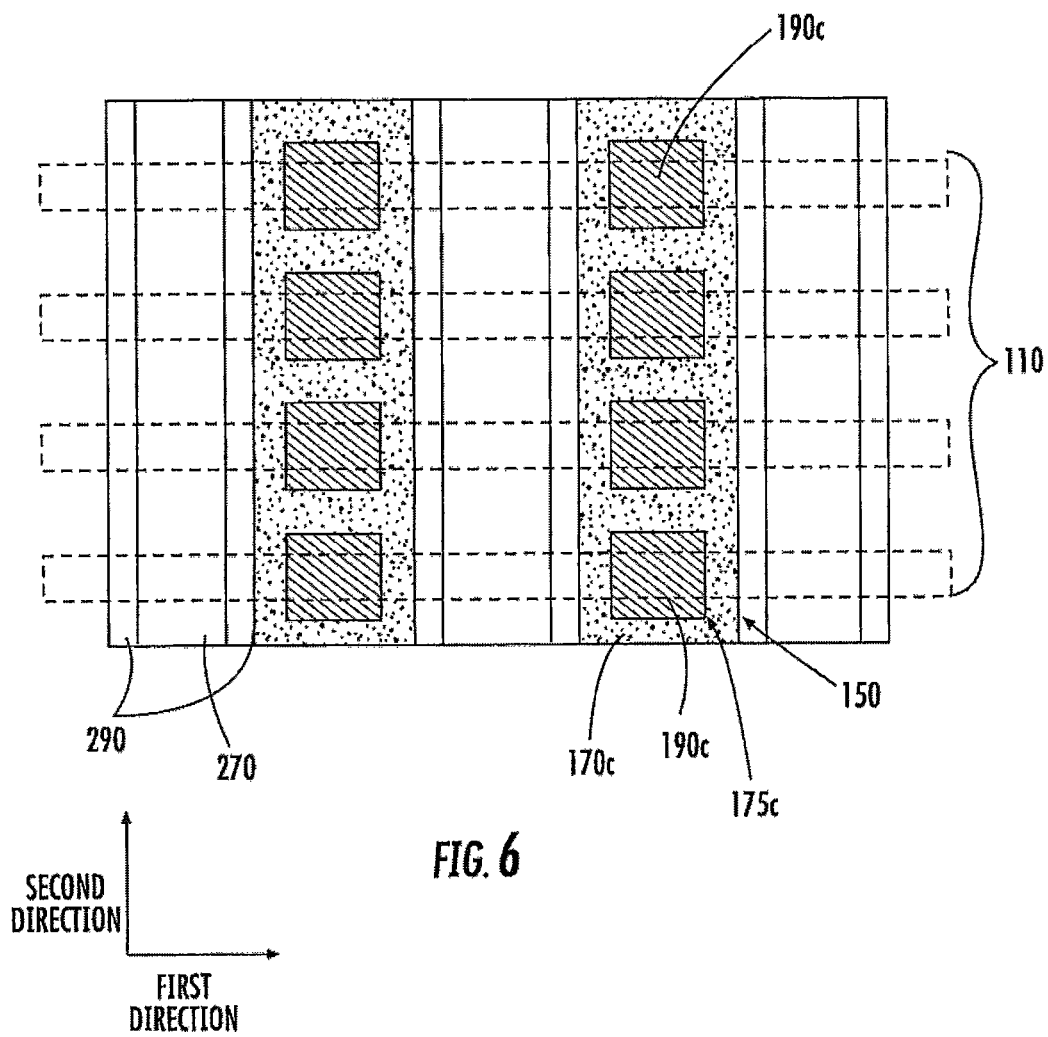

According to FIG. 6, each of semiconductor patterns 170c may include second recesses 175c that overlie respective fins 110, and metal patterns 190c may be disposed in the respective second recesses 175c. The semiconductor patterns 170c may surround the metal patterns 190c and may fill spaces between the metal patterns 190c. For example, the semiconductor patterns 170c may completely enclose the metal patterns 190c, as illustrated in FIG. 6.

Figure 7:
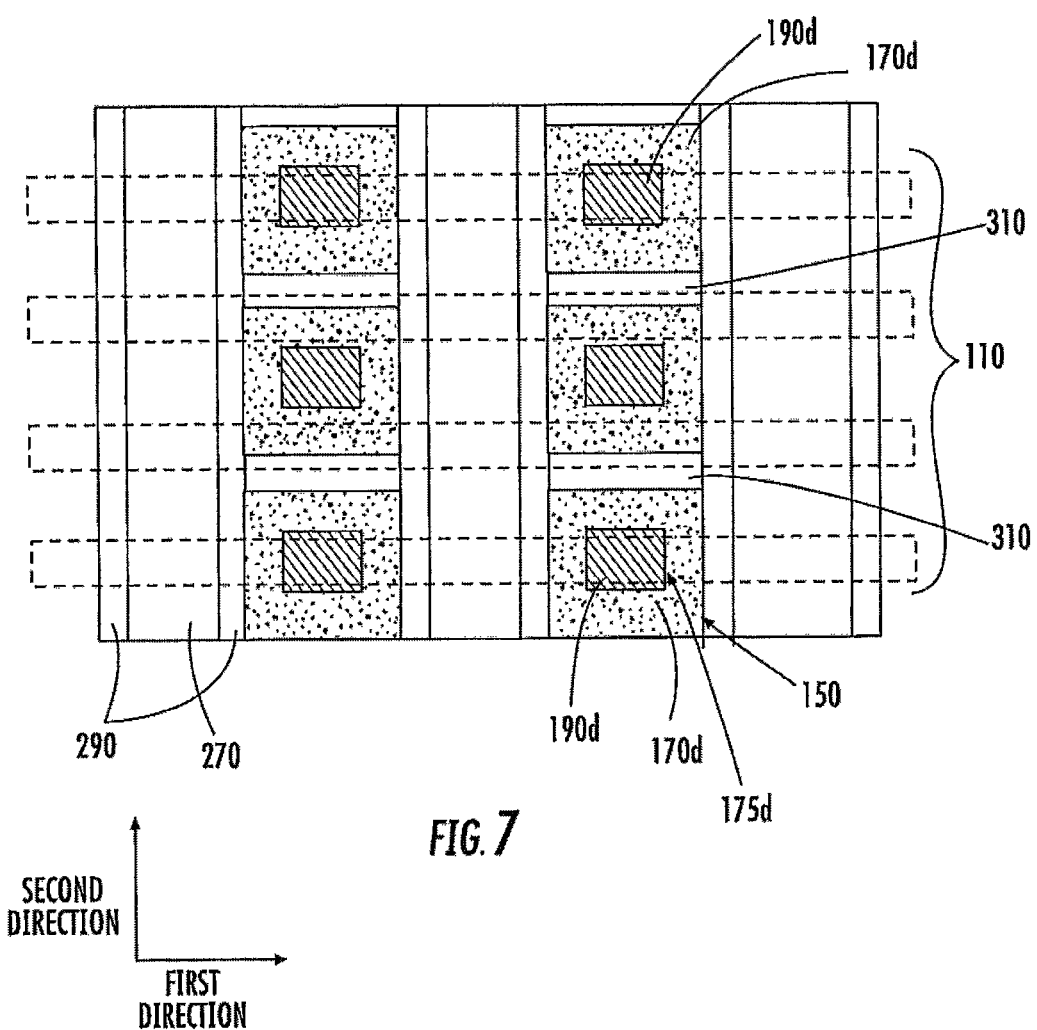

In some embodiments, more than one semiconductor pattern 170d may be disposed in one of first recesses 150 as illustrated in FIG. 7. The semiconductor patterns 170d disposed in the one of the first recesses 150 may be spaced apart from one another in a second direction and a first interlayer insulation layer 310 may be disposed between the semiconductor patterns 170d. The semiconductor patterns 170d may include respective second recesses 175d, and metal patterns 190d may be disposed in the respective second recesses 175d. The semiconductor patterns 170d may surround the respective metal patterns 190d. For example, the semiconductor patterns 170d may completely enclose the respective metal patterns 190d, as illustrated in FIG. 7. Some of the metal patterns 190d may overlie fins 110 and some of the metal patterns 190d may not overlie fins 110. The semiconductor patterns 170d may have equivalent structures and the metal patterns 190d may thus have equivalent structures.

Figure 8:
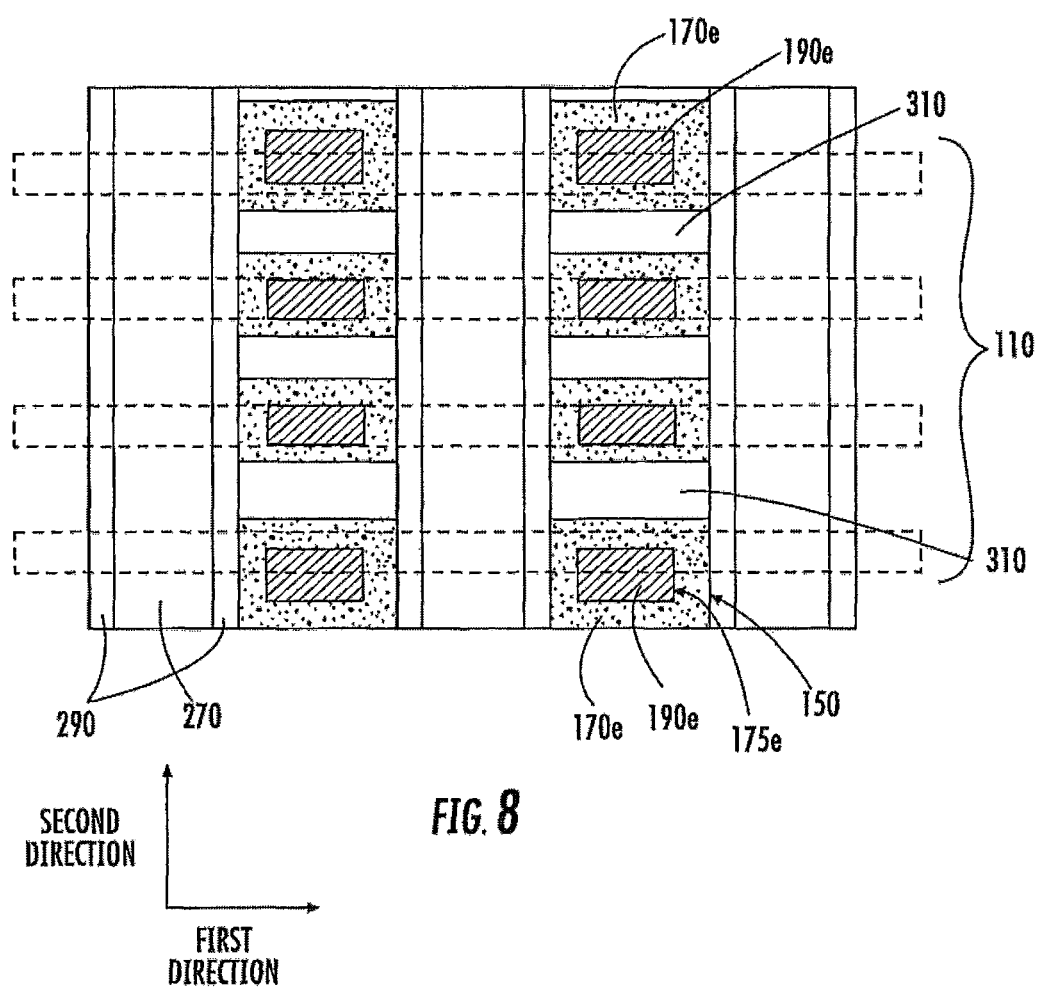

According to FIG. 8, more than one semiconductor pattern 170e may be disposed in one of first recesses 150. The semiconductor patterns 170e disposed in the one of the first recesses 150 may be spaced apart from one another in a second direction and a first interlayer insulation layer 310 may be disposed between the semiconductor patterns 170e. The semiconductor patterns 170e may include respective second recesses 175e, and metal patterns 190e may be disposed in the respective second recesses 175e. The second recesses 175e may have different widths in the second direction, and the metal patterns 190e may thus have different widths.

Figure 9:
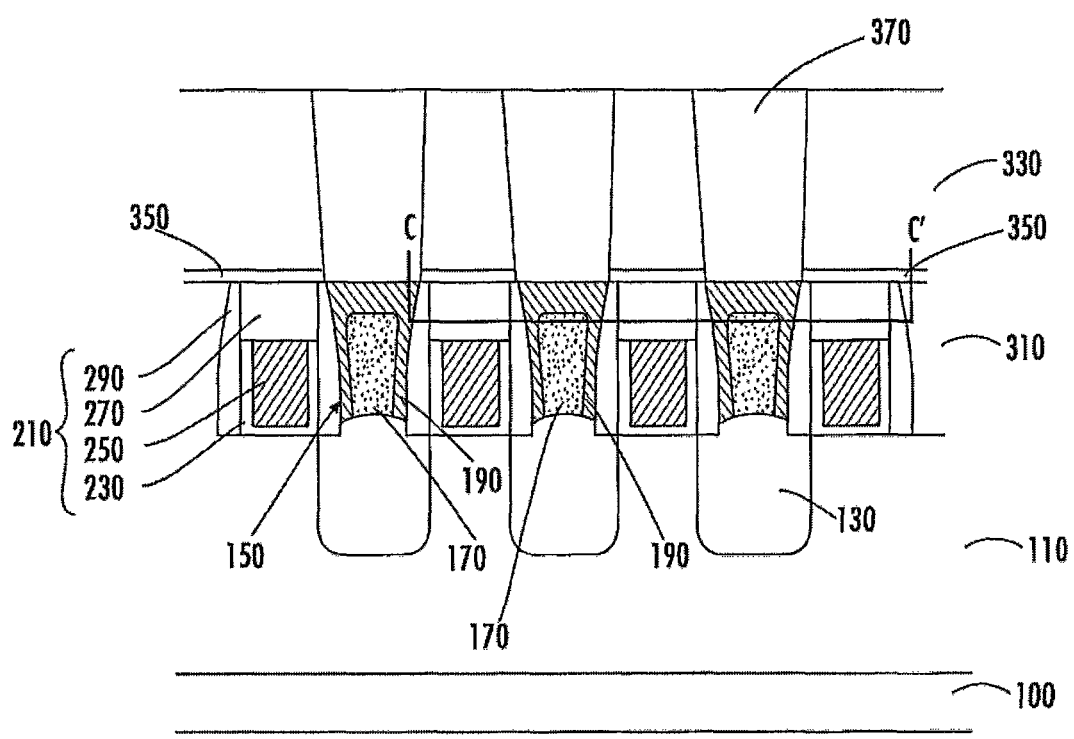
FIG. 9 is a cross-sectional view, taken along the line A-A' of FIG. 1, illustrating an integrated circuit device according to some embodiments of the present inventive concept.

FIG. 9 is a cross-sectional view, taken along the line A-A' of FIG. 1, illustrating an integrated circuit device according to some embodiments of the present inventive concept.

Referring to FIG. 9, semiconductor patterns 170 may be disposed on source/drain regions 130 disposed in a fin 110. The semiconductor patterns 170 may contact central portions of the source/drain regions 130. The semiconductor patterns 170 may be spaced apart from sidewalls of gate structures 210, and spaces may thus be defined between sidewalls of the semiconductor patterns 170 and the sidewalls of the gate structures 210. Metal patterns 190 may be disposed in the spaces between the sidewalls of semiconductor patterns 170 and the sidewalls of the gate structures 210.

In some embodiments, the metal patterns 190 may have a substantially uniform thickness on the sidewalls of the gate structures 210. The thickness of the metal patterns 190 on the sidewalls of the gate structures 210 may be in a range of about 2 nm to about 10 nm. The metal patterns 190 may cover uppermost surfaces of the semiconductor patterns 170. The metal patterns 170 may fill upper portions of the first recesses 150, and contact structures 370 may contact the metal patterns 190. According to some embodiments, a vertical distance between an upper surface of the fin 110 and an uppermost surface of the semiconductor pattern 170 may be at least about 50% of a vertical distance between the upper surface of the fin 110 and an uppermost surface of the gate structure 210.

FIGS. 10 through 14 illustrate plan views, taken along the line C-C' of FIG. 9, illustrating an integrated circuit device according to some embodiments of the present inventive concept.

Figure 10:
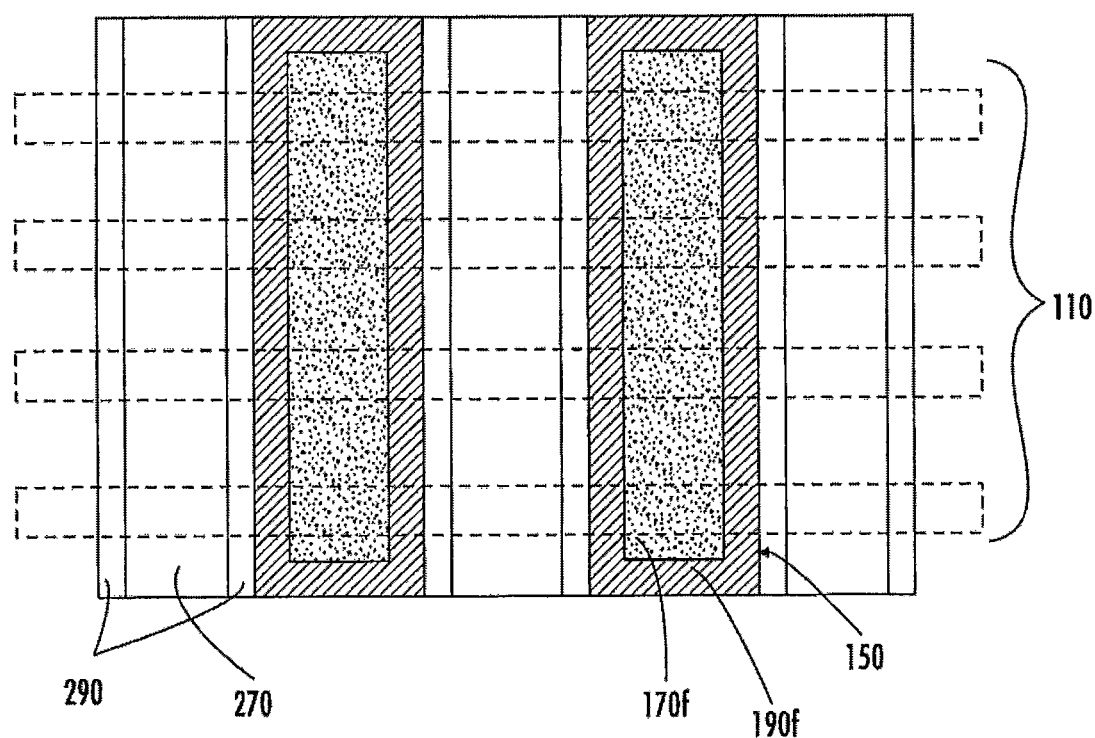
FIGS. 10 through 14 illustrate plan views, taken along the line C-C' of FIG. 9, illustrating an integrated circuit device according to some embodiments of the present inventive concept.

According to FIG. 10, gate spacers 290 may define first recesses 150, which may have a line shape extending in a second direction. Semiconductor patterns 170f may have a line shape extending in the second direction and may cross several fins 110. Metal patterns 190f may be disposed between the semiconductor patterns 170f and the gate spacers 290 and may surround the respective semiconductor patterns 170f. In some embodiments, the metal pattern 190f may completely enclose the respective semiconductor patterns 170f, as illustrated in FIG. 10.

Figure 11:
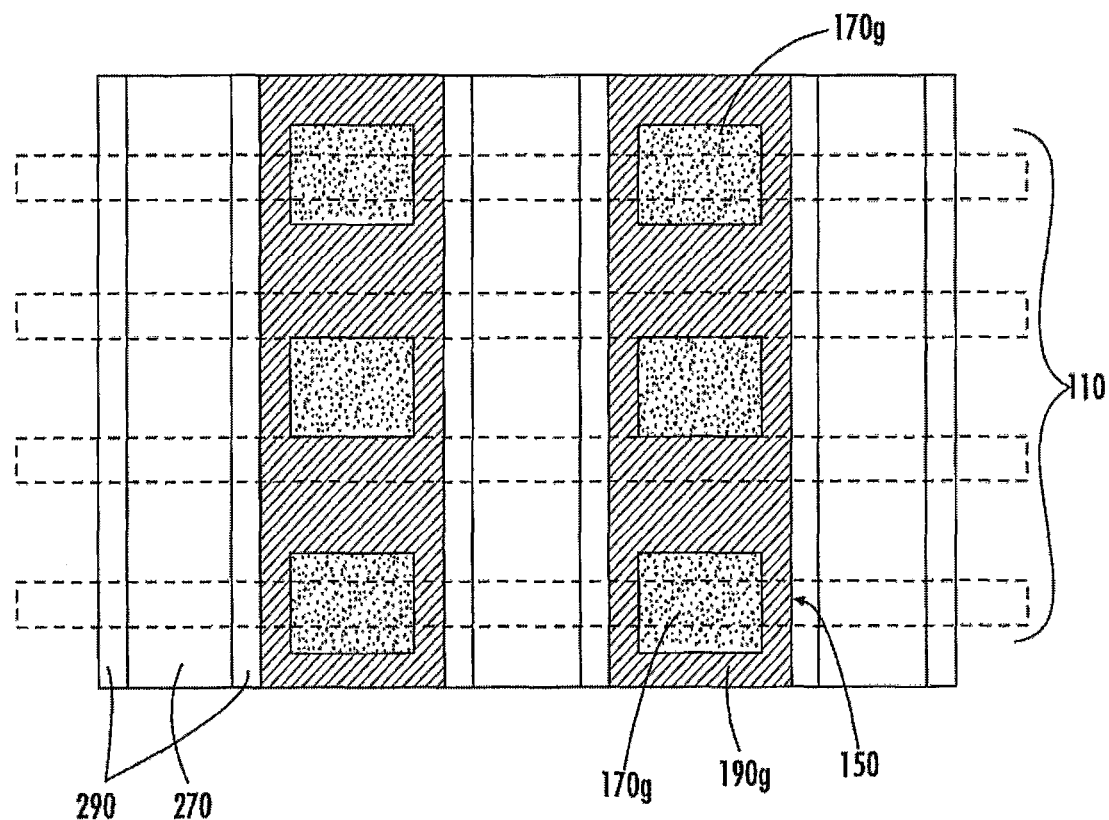

Referring to FIG. 11, more than one semiconductor pattern 170g may be disposed in one of first recesses 150 defined by gate spacers 290. The semiconductor patterns 170g disposed in the one of the first recesses 150 may be spaced apart from one another in a second direction. Metal patterns 190g may be disposed between the semiconductor patterns 170g and the gate spacers 290 and between semiconductor patterns 170g. In some embodiments, some of the semiconductor patterns 170g may overlie fins 110 and some of the semiconductor patterns 170g may not overlie fins 110, as illustrated in FIG. 11.

Figure 12:
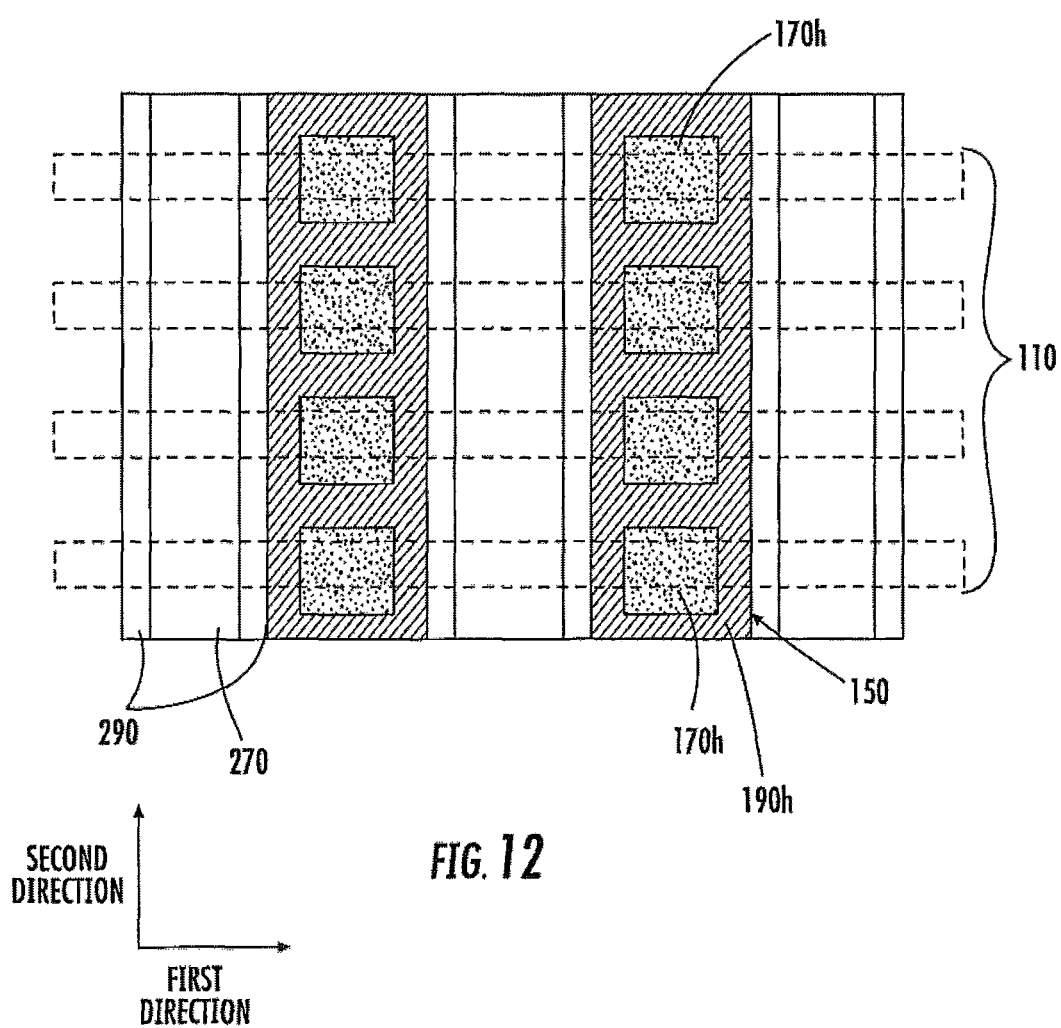

According to FIG. 12, several semiconductor patterns 170h may be disposed in one of first recesses 150 defined by gate spacers 290. The semiconductor patterns 170h may overlie respective fins 110 and may be spaced apart from one another in a second direction. Metal patterns 190h may be disposed between the semiconductor patterns 170h and the gate structures 210 and between the semiconductor patterns 170h. The metal patterns 190h may surround the semiconductor patterns 170h, and portions of the metal patterns 190h may be disposed between sidewalls of the gate spacers 290 and the semiconductor patterns 170h. The metal patterns 190h may completely enclose the semiconductor patterns 170h, as illustrated in FIG. 12.

Figure 13:
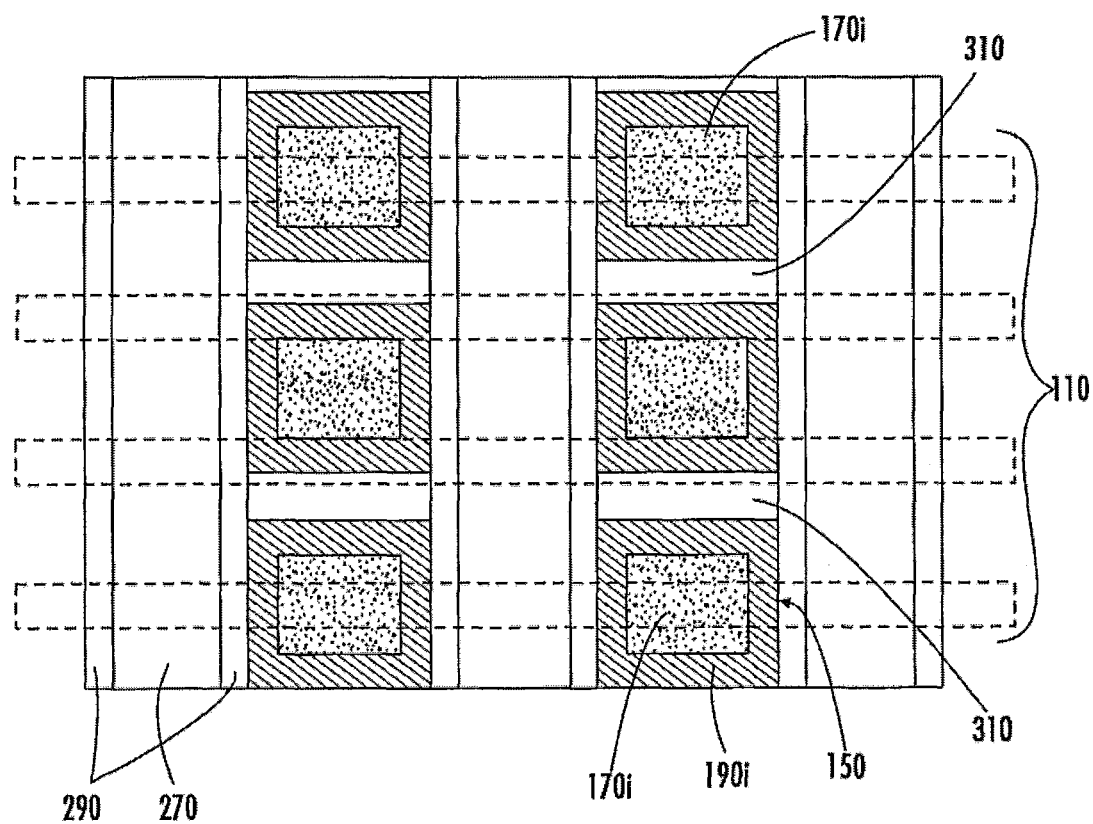

In some embodiments, more than one semiconductor pattern 170i may be disposed in one of first recesses 150 defined by gate spacers 290 as illustrated in FIG. 13. Metal patterns 190i may surround the respective semiconductor patterns 170i such that more than one metal pattern 190i may be disposed in the one of the first recesses 150. The metal patterns 190i may surround the respective semiconductor patterns 170i, as illustrated in FIG. 13, and portions of the metal patterns 190i may be disposed between semiconductor patterns 170i and the gate spacers 290. The metal patterns 190i may completely enclose the respective semiconductor patterns 170i, as illustrated in FIG. 13. The metal patterns 190i disposed in the one of the first recesses 150 may be space apart from one another in a second direction, and a first interlayer insulation layer 310 may be disposed between the metal patterns 190i. For example, the first interlayer insulation layer 310 may fill spaces between the metal patterns 190i. The semiconductor patterns 170i may have an equivalent width in the second direction.

Figure 14:
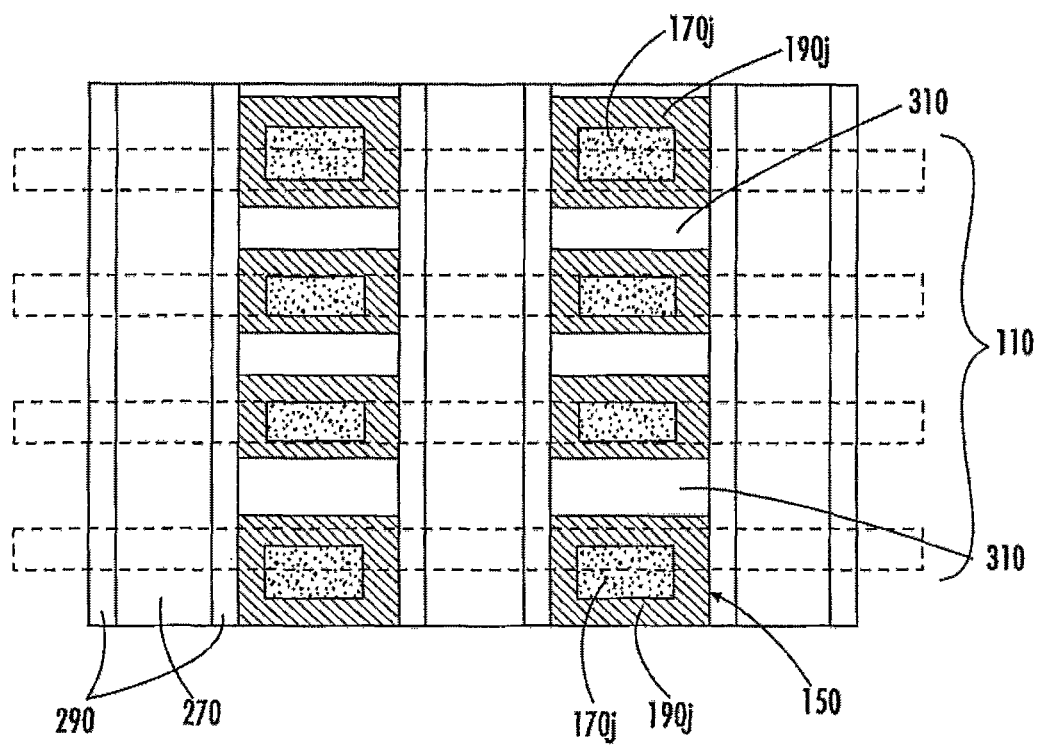

Referring to FIG. 14, more than one semiconductor pattern 170j may be disposed in one of first recesses 150 defined by gate spacers 290. Further, metal patterns 190j may surround the respective semiconductor patterns 170j, and more than one metal pattern 190j may be disposed in the one of the first recesses 150. In some embodiments, the metal patterns 190j may surround the respective semiconductor patterns 170j. The metal patterns 190j may completely enclose the respective semiconductor patterns 170j, as illustrated in FIG. 14. The metal patterns 190j may be space apart from one another in a second direction, and a first interlayer insulation layer 310 may be disposed between the metal patterns 190j. For example, the first interlayer insulation layer 310 may fill spaces between the metal patterns 190j. The semiconductor patterns 170j may not have an equivalent width in the second direction, as illustrated in FIG. 14.

Example embodiments of the present inventive concept are discussed herein with reference to a finFET. It will be understood that, however, a contact plug according to various embodiments of the present inventive concept may be applied to planar field-effect transistor (FET), and to nanowire or nanosheet transistors.

FIGS. 15 through 21 are cross-sectional views, taken along the line A-A' of FIG. 1, illustrating intermediate structures provided in a method of forming an integrated circuit device according to some embodiments of the present inventive concept.

Figure 15:
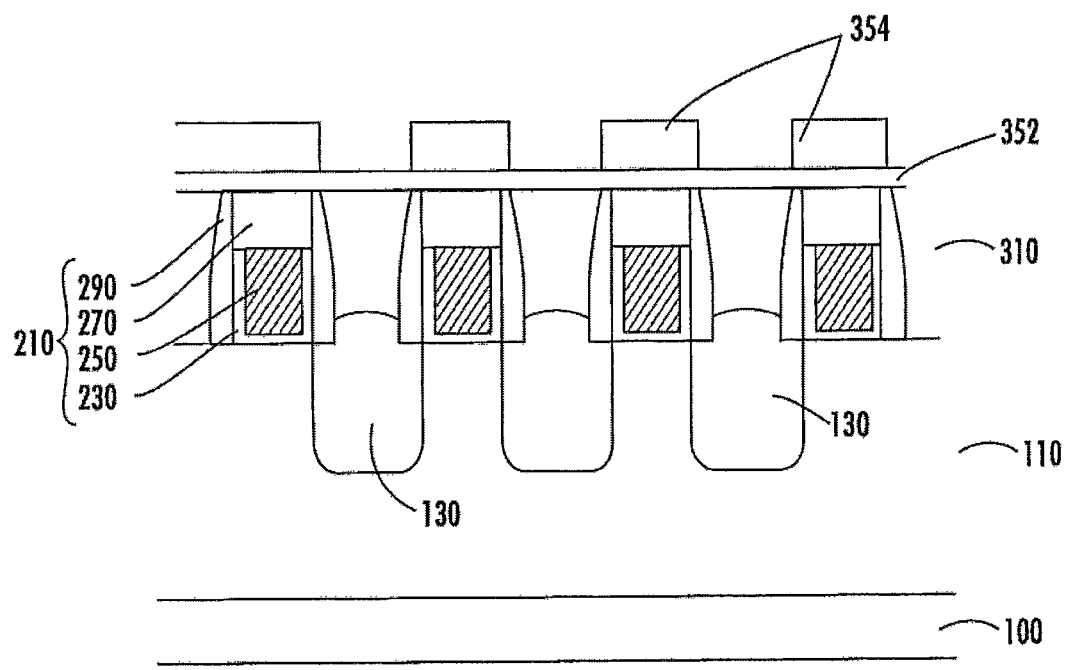
FIGS. 15 through 21 are cross-sectional views, taken along the line A-A' of FIG. 1, illustrating intermediate structures provided in a method of forming an integrated circuit device according to some embodiments of the present inventive concept.

Referring to FIG. 15, gate structures 210 may be formed on a fin 110 disposed on a substrate 100. Each of the gate structures 210 may include a gate insulation layer 230, a gate electrode 250, a gate capping pattern 270 and a gate spacer 290. Source/drain regions 130 may be formed in the fin 110 between the gate structures 210. For example, the source/drain regions 130 may be formed by implanting impurities into the fin 110 or by etching portions of the fin 110 and then epitaxially growing the source/drain regions 130 using the fin 110 as a seed layer. The epitaxially grown source/drain regions 130 may have upper portions, which protrude from an upper surface of the fin 110 and have widths greater than a width of the fin 110. The epitaxially grown source/drain regions 130 may have lower portions disposed in the fins 110, which may thus have widths substantially equivalent to the width of the fins 110. A first interlayer insulation layer 310 may be formed on the gate structures 210 and the source/drain regions 130. The first interlayer insulation layer 310 may surround the gate structures 210 and may cover the source/drain regions 130.

In some embodiments, a protective layer 352 may be formed on the first interlayer insulation layer 310, and first mask patterns 354 may be formed on the protective layer 352. According to some embodiments, the protective layer 352 may not be formed on the first interlayer insulation layer 310, and the first mask patterns 354 may be formed directly on the gate structures 210. The protective layer 352 may protect the first interlayer insulation layer 310 during subsequent processes. The protective layer 352 may include, for example, nitride. For example, the first mask patterns 354 may include photo resist patterns and/or hard mask patterns.

Figure 16:
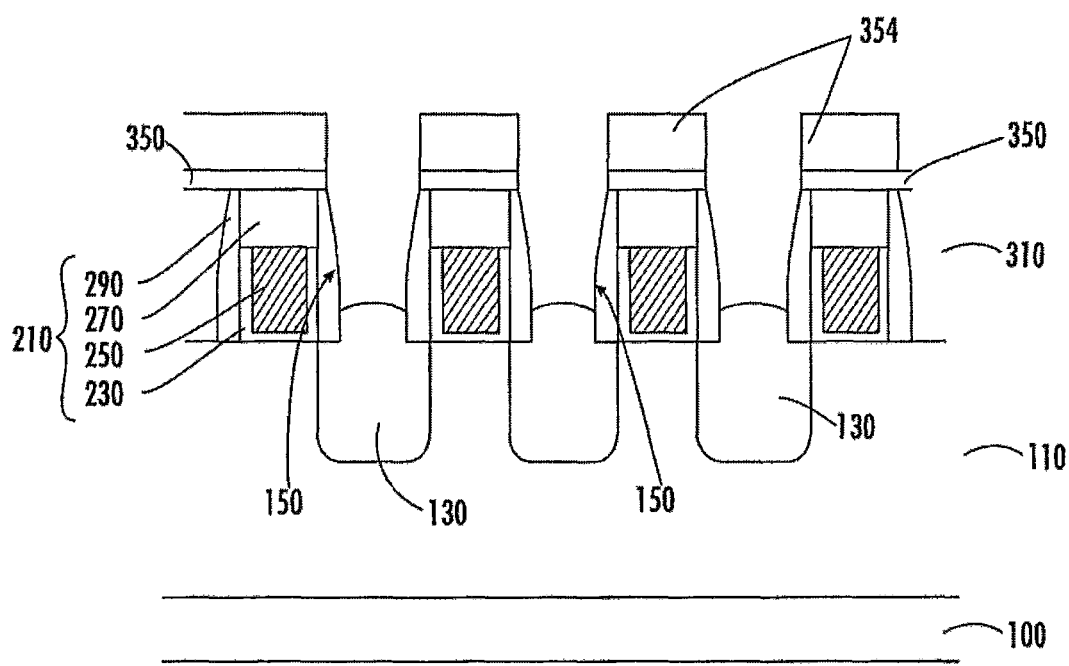

According to FIG. 16, the protective layer 352 and the first interlayer insulation layer 310 may be etched using the first mask patterns 354 as an etching mask and thereby forming protective layer patterns 350 and first recesses 150 between the gate structures 210. The first recesses 150 may expose the source/drain regions 130. The first mask patterns 354 may be removed after the first recesses 150 are formed.

Figure 17:
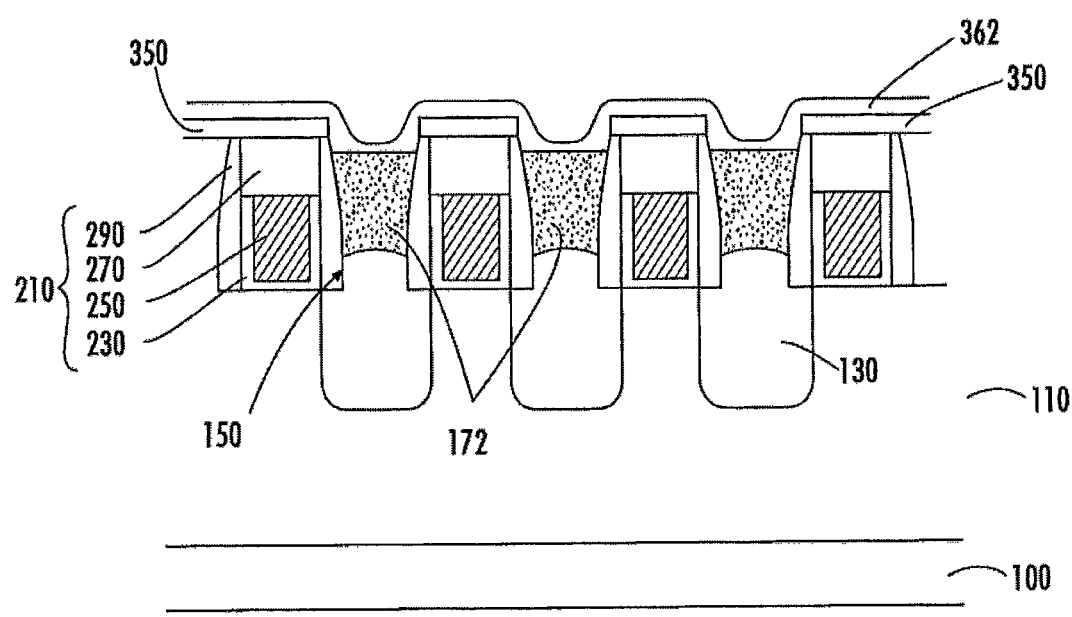
Figure 18:
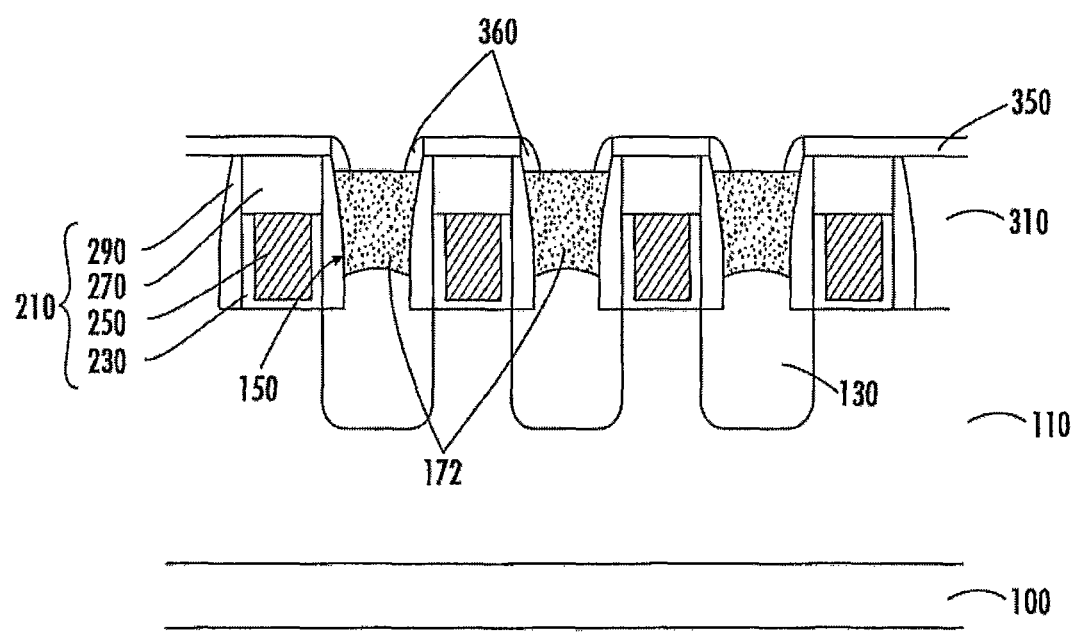

Referring to FIG. 17, preliminary semiconductor patterns 172 may be formed in the first recesses 150. In some embodiments, the preliminary semiconductor patterns 172 may fill the first recesses 150 and may contact the gate spacers 290 as illustrated in FIG. 17. In some embodiments, however, the preliminary semiconductor patterns 172 may only partially fill the first recesses 150. For example, the preliminary semiconductor patterns 172 may be formed using an epitaxial growth process using the source/drain regions 130 as a seed layer such that the preliminary semiconductor patterns 172 may be selectively formed in the first recesses 150. In some embodiments, the preliminary semiconductor patterns 172 may be formed using a deposition process. For example, a preliminary semiconductor layer may be formed on the structure illustrated in FIG. 16, including on the protective layer patterns 350, using a deposition process, and then an upper portion of the preliminary semiconductor layer may be removed to form the preliminary semiconductor patterns 172. The upper portion of the preliminary semiconductor layer may be removed using, for example, an etching process and/or a chemical mechanical polishing (CMP) process. It will be understood that, in some embodiments, the preliminary semiconductor patterns 172 may be formed conformally on the structure illustrated in FIG. 16 using a deposition process.

A second mask layer 362 may be formed on the protective layer patterns 350 and the preliminary semiconductor patterns 172. The second mask layer 362 may include a material having an etch selectivity with respect to the preliminary semiconductor patterns 172, for example, oxide and may have a substantially uniform thickness as illustrated in FIG. 17. According to FIG. 18, second mask patterns 360 may be formed on sidewalls of the gate structures 210 and the protective layer patterns 350. The second mask patterns 360 may cover edge portions of the preliminary semiconductor patterns 172 and may expose central portions of the preliminary semiconductor patterns 172. The second mask patterns 360 may be formed by anisotropically etching the second mask layer 362.

Figure 19:
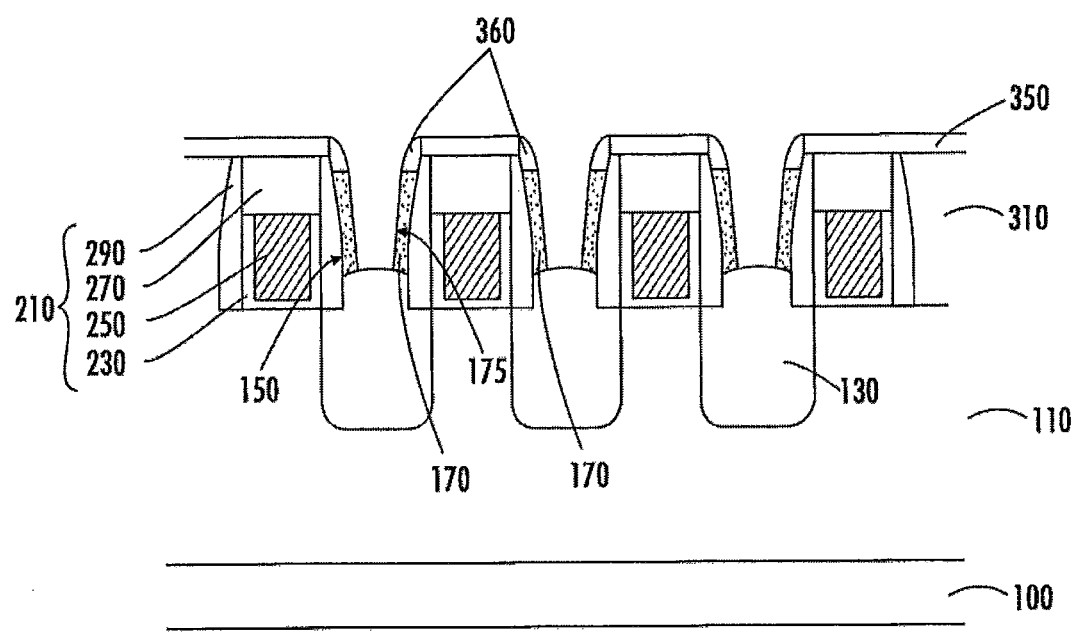

Referring to FIG. 19, the preliminary semiconductor patterns 172 may be etched using the second mask patterns 360 as an etch mask and thereby forming semiconductor patterns 170. For example, the preliminary semiconductor patterns 172 may be etched until upper surfaces of the source/drain regions 130 are exposed, as illustrated in FIG. 19. In some embodiments, the preliminary semiconductor patterns 172 may remain on the upper surfaces of the source/drain regions 130. The semiconductor patterns 170 may have a substantially uniform thickness on the sidewalls of the gate structures 210 and may define second recesses 175 in the first recesses 150. In some embodiments, an impurity or a dopant implantation process (e.g., plasma doping (PLAD) process) and/or an annealing process may be performed after the semiconductor patterns 170 are formed to increase concentrations of impurities and dopants and/or activations of dopants in the semiconductor patterns 170.

In some embodiments, the semiconductor patterns 170 may be formed without using the second mask patterns 360. For example, a preliminary semiconductor layer may be formed conformally on the structure illustrated in FIG. 16 using a deposition process, and then the semiconductor patterns 170 may be formed by removing portions of the preliminary semiconductor layer that are formed on the protective layer patterns 350 and on the upper surfaces of the source/drain regions 130. The portions of the preliminary semiconductor layer may be removed using, for example, an anisotropic etching process.

Figure 20:
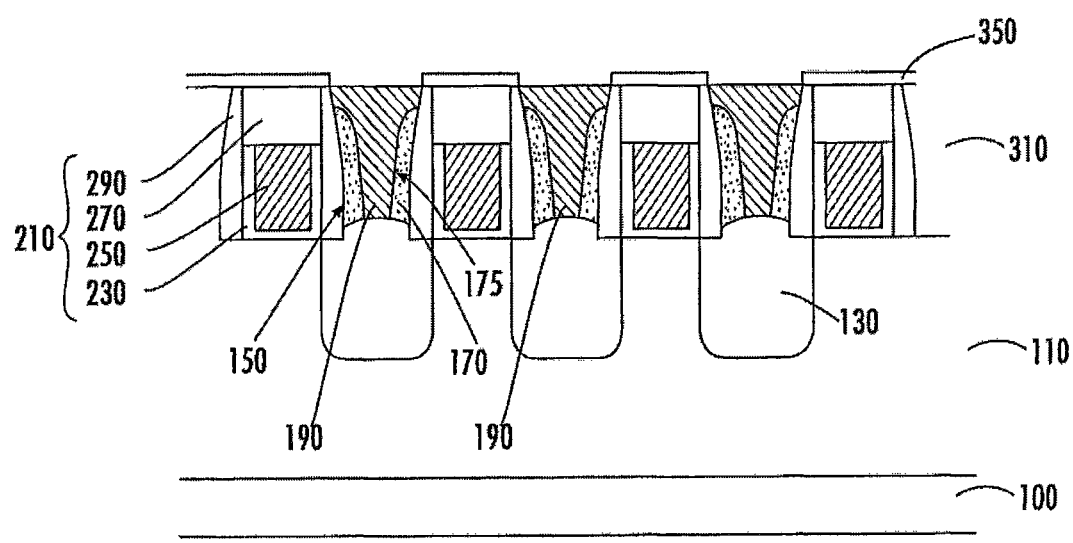

Now referring to FIG. 20, metal patterns 190 may be formed in the first and second recesses 150 and 175. Specifically, lower portions of the metal patterns 190 may be formed in the second recesses 175 and may contact the semiconductor patterns 170. Accordingly, the semiconductor patterns 170 may be disposed between the sidewalls of the gate structures 210 and sidewall of the metal patterns 190. In some embodiments, the metal patterns 190 may be selectively formed in the first and second recesses 150 and 175. In some embodiments, the metal patterns 190 may be formed using a deposition and may be formed on the protective layer patterns 350. The metal patterns 190 formed on the protective layer patterns 350 may be removed using an etching process and/or a CMP process.

Upper surfaces of the metal patterns 190 may be substantially coplanar with upper surfaces of the protective layer patterns 350 or may be recessed from the upper surfaces of the protective layer patterns 350. According to some embodiments, implanting impurities into the metal patterns 190 using, for example, PLAD process, and/or annealing the substrate 100 may be additionally performed after the metal patterns 190 are formed. According to some embodiments, insulation patterns may be formed between the semiconductor patterns 170 and the metal patterns 190 to form metal-insulator-semiconductor (MIS) contacts therebetween.

Figure 21:
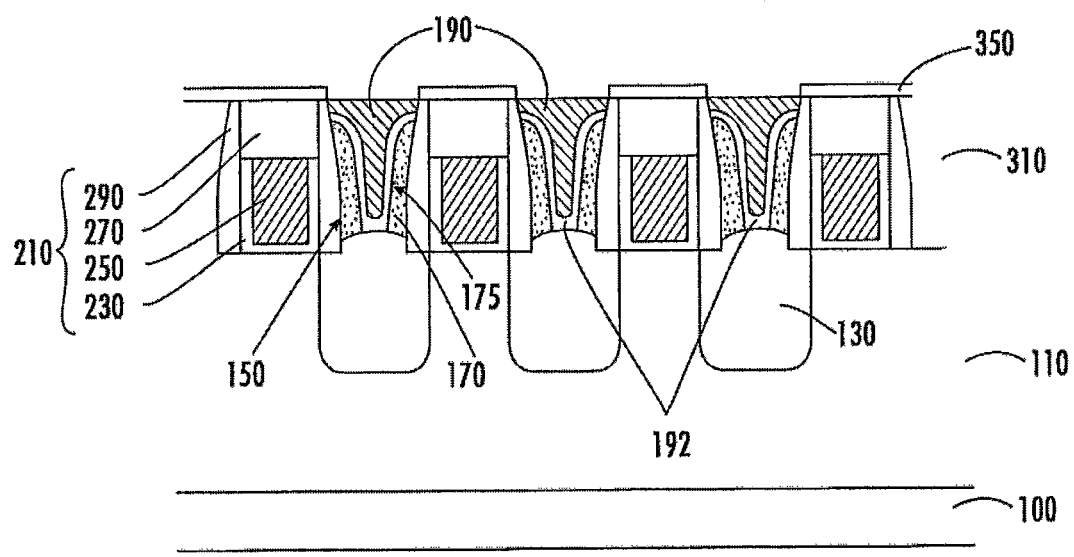

In some embodiments, metallic compound patterns 192 may be formed at interfaces between the semiconductor patterns 170 and the metal patterns 190 as illustrated in FIG. 21. For example, forming the metallic compound patterns 192 may include forming a metal layer on the semiconductor patterns 170 and the metallic compound patterns 192 may be formed through a reaction between the semiconductor patterns 170 and the metal layer. Portions of the metal layer, which are not reacted with the semiconductor patterns 170, may be removed, and the metal pattern 190 may be formed on the metallic compound patterns 192. For example, the metallic compound patterns 192 may include metal silicide.

Figure 22:
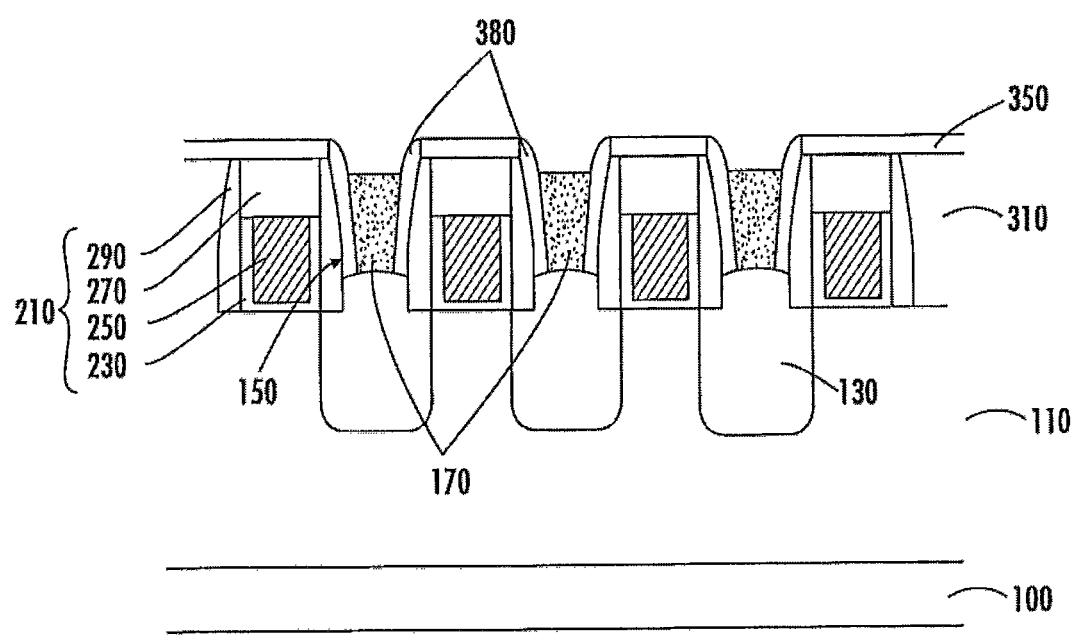
FIGS. 22 and 23 are cross-sectional views, taken along the line A-A' of FIG. 1, illustrating intermediate structures provided in a method of forming an integrated circuit device according to some embodiments of the present inventive concept.
Figure 23:
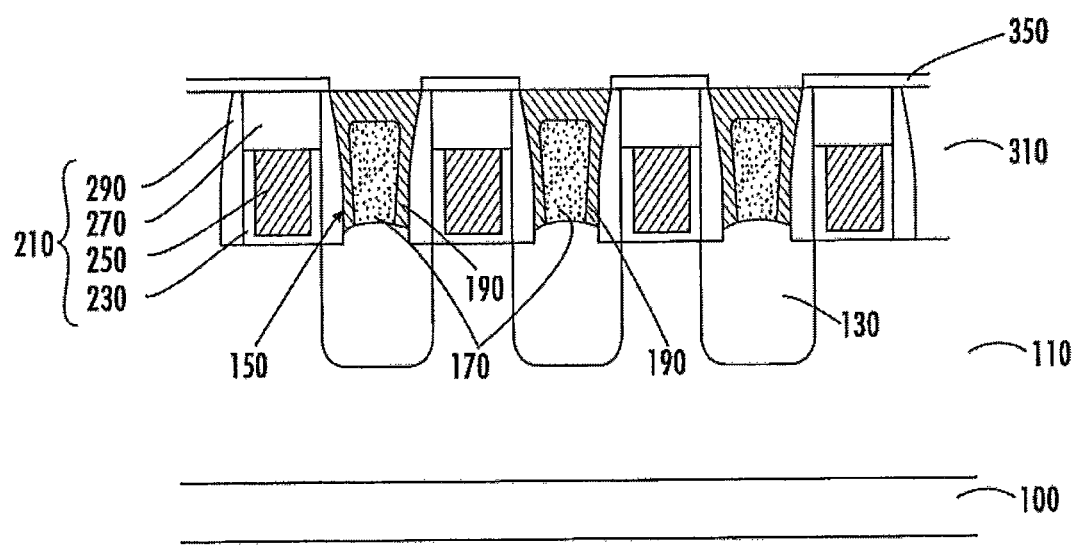

FIGS. 22 and 23 are cross-sectional views, taken along the line A-A' of FIG. 1, illustrating intermediate structures provided in a method of forming an integrated circuit device according to some embodiments of the present inventive concept.

Referring to FIG. 22, sacrificial patterns 380 may be formed on sidewalls of gate structures 210 after first recesses 150 are formed. The first recesses 150 may be formed using substantially the same or similar processes discussed with reference to FIGS. 15 and 16. For example, forming the sacrificial patterns 380 may include forming a sacrificial layer that has a substantially uniform thickness on the protective layer patterns 350, the sidewalls of the gate structures 210 and source/drain regions 130 and performing an anisotropic etching process to etch the sacrificial layer. The sacrificial patterns 380 may expose source/drain regions 130. The sacrificial patterns 380 may include, for example, oxide. Protective layer patterns 350 may protect a first interlayer insulation layer 310 when the sacrificial layer is etched. The protective layer patterns 350 may include materials having an etch selectivity with respect to the sacrificial layer. In some embodiments, the protective layer patterns 350 may not be formed and the first interlayer insulation layer 310 may include materials having an etch selectivity with respect to the sacrificial layer.

Semiconductor patterns 170 may be formed in spaces defined by the sacrificial patterns 380. The semiconductor patterns 170 may fill the spaces defined by the sacrificial patterns 380 and may contact the sacrificial patterns 380. In some embodiments, forming the semiconductor patterns 170 may include forming preliminary semiconductor patterns having upper surfaces substantially coplanar with upper surfaces of the protective layer patterns 350 and then removing (e.g., etching) upper portions of the preliminary semiconductor patterns. According to some embodiments, upper surface of the semiconductor patterns 170 may be substantially coplanar with the upper surfaces of the protective layer patterns 350.

According to FIG. 23, the sacrificial patterns 380 may be removed and thereby forming gaps between the gate structures 210 and the semiconductor patterns 170. The protective layer patterns 350 may protect a first interlayer insulation layer 310 when the sacrificial patterns 380 are removed. In some embodiments, the protective layer patterns 350 may not be formed and the first interlayer insulation layer 310 may include materials having an etch selectivity with respect to the sacrificial patterns 380.

Metal patterns 190 may be formed in the gaps between the gate structures 210 and the semiconductor patterns 170 and on the semiconductor patterns 170. For example, forming the metal patterns 190 may include forming a metal layer in the gaps between the gate structures 210 and the semiconductor patterns 170 and on the protective layer patterns 350 and then removing the metal layer formed on the protective layer patterns 350 such that the metal patterns 190 may be isolated from one another. For example, the metal patterns 190 may include metallic compound patterns formed through a reaction between the semiconductor patterns 170 and the metal patterns 190. In some embodiments, upper surface of the metal patterns 190 may be substantially coplanar with the upper surfaces of the protective layer patterns 350.

Figure 24:
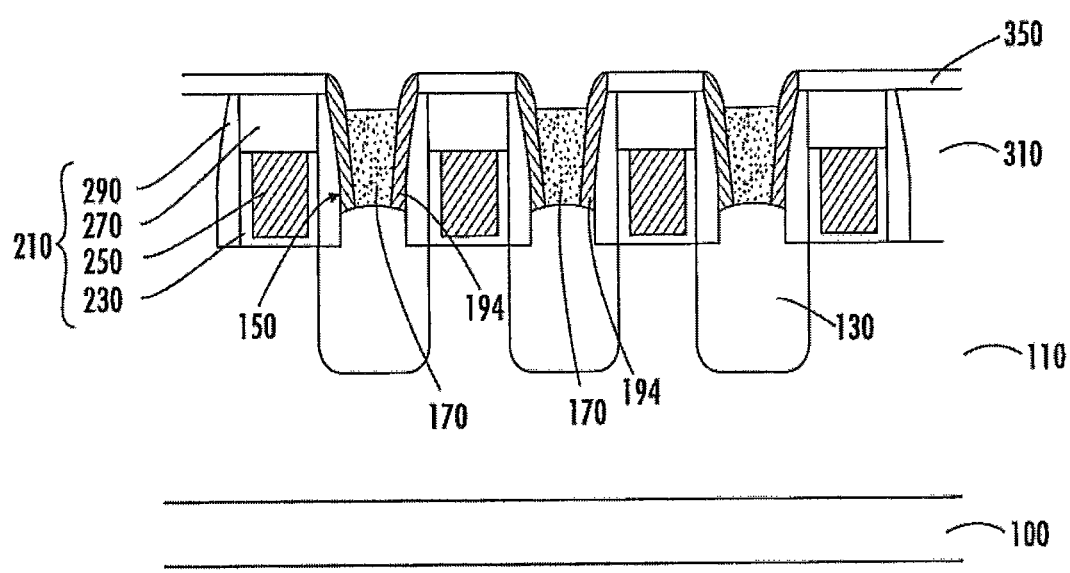
FIGS. 24 and 25 are cross-sectional views, taken along the line A-A' of FIG. 1, illustrating intermediate structures provided in a method of forming an integrated circuit device according to some embodiments of the present inventive concept.
Figure 25:
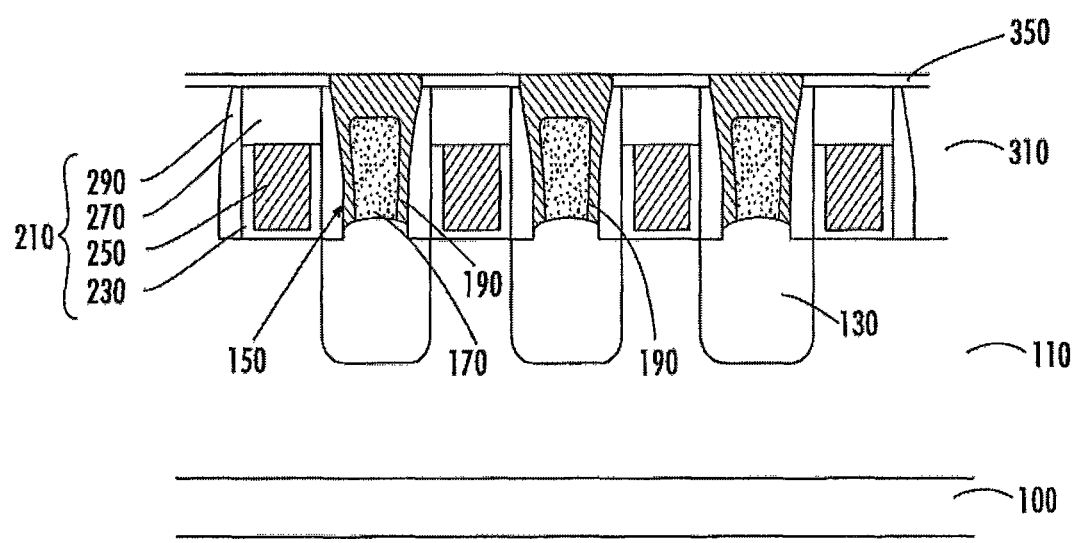

FIGS. 24 and 25 are cross-sectional views, taken along the line A-A' of FIG. 1, illustrating intermediate structures provided in a method of forming an integrated circuit device according to some embodiments of the present inventive concept.

As illustrated in FIG. 24, preliminary metal patterns 194 may be formed on sidewalls of the gate structures 210 after first recesses 150 are formed. The preliminary metal patterns 194 may expose source/drain regions 130. For example, forming the preliminary metal patterns 194 may include forming a metal layer having a substantially uniform thickness on protective layer patterns 350, the sidewalls of the gate structures 210 and the source/drain regions 130 and then performing an anisotropic etching process to etch the metal layer. The protective layer patterns 350 may protect first interlayer insulation layer 310 when the metal layer is etched. In some embodiments, the protective layer patterns 350 may not be formed and the first interlayer insulation layer 310 may include materials having an etch selectivity with respect to the metal layer.

Semiconductor patterns 170 may be formed in spaces defined by the preliminary metal patterns 194. In some embodiments, preliminary semiconductor patterns, which may have upper surfaces substantially coplanar with upper surfaces of the protective layer patterns 350, may be formed in the spaces defined by the preliminary metal patterns 194 and then upper portions of the preliminary semiconductor patterns may be removed to form the semiconductor patterns 170. According to some embodiments, upper surface of the semiconductor patterns 170 may be substantially coplanar with the upper surfaces of the protective layer patterns 350.

Referring to FIG. 25, metal patterns 190 including the preliminary metal patterns 194 may be formed. Specifically, a metal layer may be formed on the protective layer patterns 350, the preliminary metal patterns 194 and the semiconductor patterns 170, and then the metal layer formed on the protective layer patterns 350 may be removed using, for example, an etching process and/or a CMP process. Accordingly, upper surfaces of the metal patterns 190 may be substantially coplanar with the upper surfaces of the protective layer patterns 350, as illustrated in FIG. 25. In some embodiments, the protective layer patterns 350 may not be formed and the upper surfaces of the metal patterns 190 may thus be substantially coplanar with uppermost surfaces of the gate structures 210. In some embodiments, the upper surfaces of the metal patterns 190 may be recessed from the upper surfaces of the protective layer patterns 350, as illustrated in FIG. 23.

The metal patterns 190 may be a single layer or a stack including two or more layers including metals. In some embodiments, the metal patterns 190 may include metallic compound patterns formed through a reaction between the semiconductor patterns 170 and the metal patterns 190.

Figure 26:
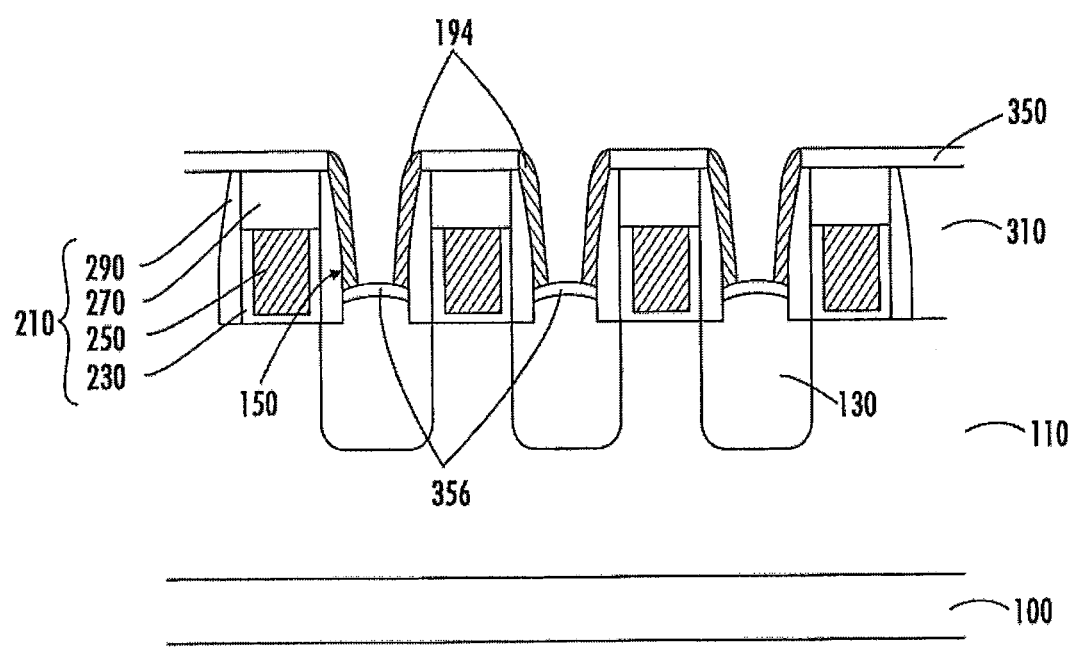
FIGS. 26 and 27 are cross-sectional views, taken along the line A-A' of FIG. 1, illustrating intermediate structures provided in a method of forming an integrated circuit device according to some embodiments of the present inventive concept.
Figure 27:
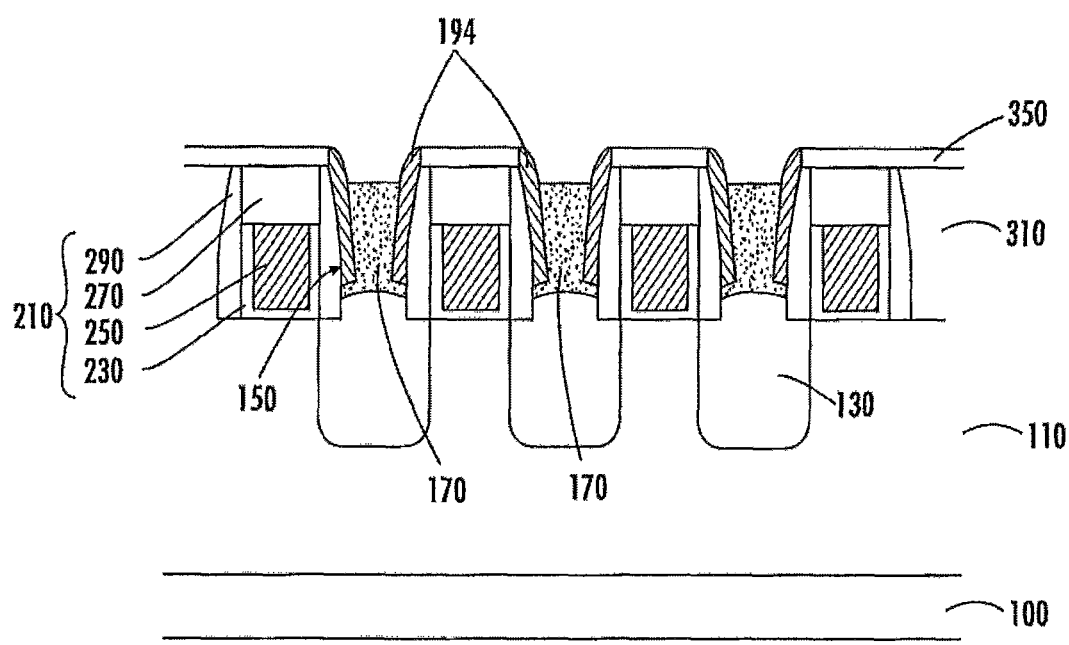

FIGS. 26 and 27 are cross-sectional views, taken along the line A-A' of FIG. 1, illustrating intermediate structures provided in a method of forming an integrated circuit device according to some embodiments of the present inventive concept.

According to FIG. 26, protective patterns 356 may be formed on source/drain regions 130 after first recesses 150 are formed. The protective patterns 356 may contact upper surfaces of the source/drain regions 130. Preliminary metal patterns 194 may be formed on sidewalls of the gate structures 210 and on the protective patterns 356. For example, forming the preliminary metal patterns 194 may include forming a metal layer having a substantially uniform thickness on protective layer patterns 350, the sidewalls of the gate structures 210 and the protective patterns 356 and then performing an anisotropic etching process to etch the metal layer. When the metal layer is etched, the protective patterns 356 may protect the source/drain regions 130, and the protective layer patterns 350 may protect a first interlayer insulation layer 310. The protective patterns 356 may include, for example, oxide.

Referring to FIG. 27, the protective patterns 356 may be removed and then the semiconductor patterns 170 may be formed. The protective layer patterns 350 may also protect the first interlayer insulation layer 310 when the protective patterns 356 are removed. The semiconductor patterns 170 may be formed in spaces from which the protective patterns 356 are removed and recesses defined by the preliminary metal patterns 194. In some embodiments, upper surface of the semiconductor patterns 170 may be recessed from upper surfaces of the protective layer patterns 350 using, for example, an etching process and a metal layer may be formed on the semiconductor patterns 170 to form metal patterns 190, as illustrated in FIG. 25.

Figure 28:
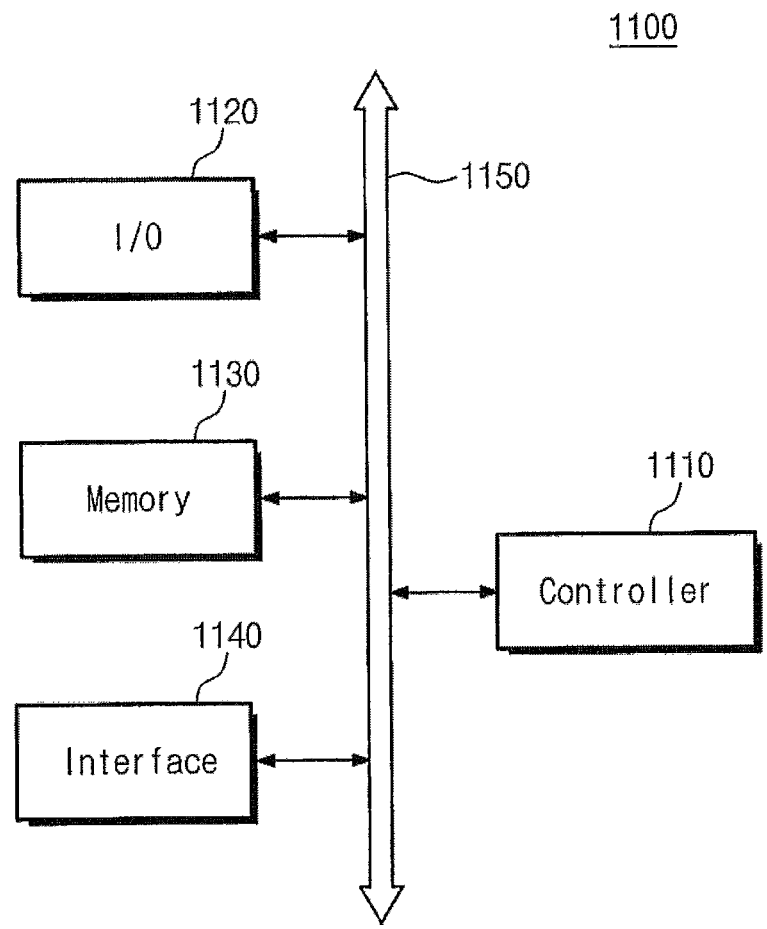
FIGS. 28 and 29 are block diagrams illustrating examples of electronic systems including an integrated circuit device according to some embodiments of the present inventive concept.

FIG. 28 is a block diagram illustrating an example of an electronic system including an integrated circuit device according to some embodiments of the present inventive concept. Referring to FIG. 28, an electronic system 1100 may include a controller 1110, an input/output (I/O) circuit 1120, a memory device 1130, an interface circuit 1140 and a data bus 1150. The controller 1110, the I/O circuit 1120, the memory device 1130 and the interface circuit 1140 may communicate with each other through the data bus 1150. The data bus 1150 may correspond to a path through which electrical signals are transmitted. The controller 1110, the I/O circuit 1120, the memory device 1130, and/or the interface circuit 1140 may include an integrated circuit device according to some embodiments of the present inventive concept.

The controller 1110 may include at least one of a microprocessor, a digital signal processor, a microcontroller or another logic device. Another logic device may have a similar function to any one of the microprocessor, the digital signal processor and the microcontroller. The I/O circuit 1120 may include a keypad, a keyboard and/or a display unit. The memory device 1130 may store data and/or commands. The interface circuit 1140 may transmit electrical data to a communication network or may receive electrical data from a communication network. The interface circuit 1140 may operate by wirelessly or over a cable. For example, the interface circuit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information wirelessly.

Figure 29:
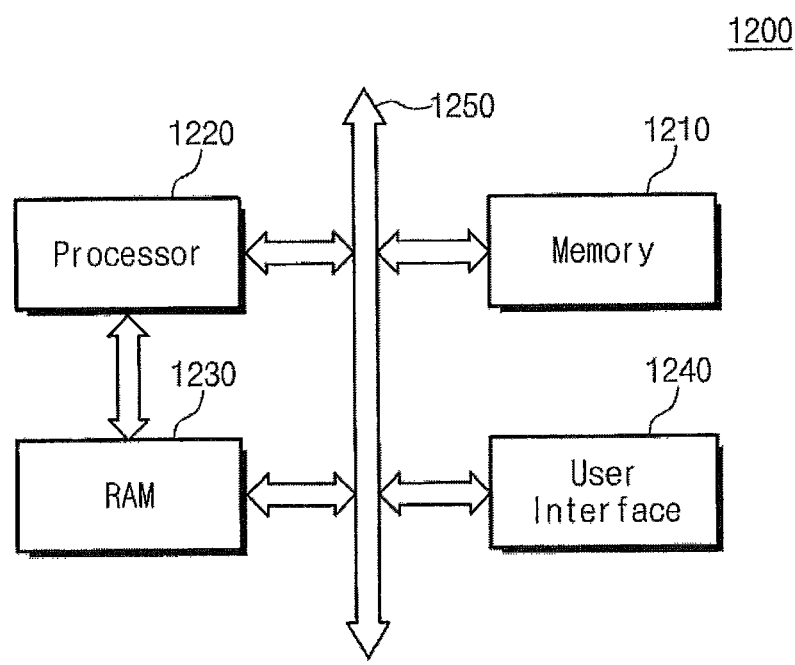

FIG. 29 is a block diagram illustrating an example of an electronic system including an integrated circuit device according to some embodiments of the present inventive concept. Referring to FIG. 29, an electronic system 1200 may include at least one of integrated circuit devices according to some embodiments of the present inventive concept. The electronic system 1200 may include a mobile device or a computer. For example, the electronic system 1200 may include a memory system 1210, a processor 1220, a random access memory (RAM) device 1230, and a user interface unit 1240 that communicate with each other through a data bus 1250. The processor 1220 may execute a program and may control the electronic system 1200. The RAM device 1230 may be used as an operational memory. For example, the processor 1220 and the RAM device 1230 may include the semiconductor devices according to some embodiments of the present inventive concept, respectively. Alternatively, the processor 1220 and the RAM device 1230 may be included in one package. The user interface unit 1240 may be used for data input/output to/from the electronic system 1200. The memory system 1210 may store data output from an external system or data processed by the processor 1220 or a code for operating the processor 1220. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music player, and an information transmitting/receiving system. If the electronic system 1200 performs wireless communications, the electronic system 1200 may be used in a communication interface protocol of a three-generation communication system CDMA, GSM, NADC, E-TDMA, WCDMA, or CDMA2000.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device, comprising:
   a fin on a substrate;
   first and second gate structures on the fin, wherein sidewalls of the first and second gate structures define a recess therebetween;
   a source/drain region in the fin between the first and second gate structures; and
   a contact plug on the source/drain region and in the recess, the contact plug comprising an inner portion comprising a first material and an outer portion comprising a second material different from the first material, wherein:
   the inner portion of the contact plug contacts the source/drain region;
   the outer portion at least partially covers a sidewall of the inner portion; and
   a portion of the outer portion is disposed between the sidewall of the first gate structure and the sidewall of the inner portion.

2. The integrated circuit device of claim 1, wherein the inner portion and the outer portion have a specific interface resistivity less than about 1e–8 Ω-cm².

3. The integrated circuit device of claim 1, wherein:
   a first one of the first material and the second material is a semiconductor material comprising Si, SiGe, InGaAs, InAs, Ge, InSb, GaSb, InGaSb, III-V semiconductor material or II-VI semiconductor material, or combinations thereof; and
   a second one of the first material and the second material is a metal comprising Ni, Ti, Ta, TaN, TiN, TiC, W, TiAl, Ru, Al, La, Co, Pt, Pd, Mo or alloys thereof.

4. The integrated circuit device of claim 3, wherein the outer portion contacts the inner porion.

5. An integrated circuit device, comprising:
   a fin on a substrate;
   first and second gate structures on the fin, wherein sidewalk of tine first and second gate structures define a recess therebetween;
   a source/drain in the fin between the first and second gate structures;
   a contact plug on the source/drain region and in the recess, the contact plug comprising an inner portion comprising a first material and an outer portion comprising a second, material different from the first material; and
   an insulating layer between the outer portion and the inner portion, wherein:
   a first one of the first material and the second material is a semiconductor material, and a second one of the first material and the second material is a metal:
   the outer portion at least partially covers a sidewall of the inner portion; and
   a portion of the outer portion is disposed between the sidewall of the first gate structure and the sidewall of the inner portion.

6. The integrated circuit device of claim 5, wherein he insulating layer comprises titanium oxide or zirconium oxide.

7. The integrated circuit device of claim 1, wherein:
   the outer portion comprises a semiconductor material; and
   the inner portion comprises a metal.

8. The integrated circuit device of claim 7, further comprising a channel region in the fin wherein:
   the first gate structure overlies the channel region; and
   a lowermost surface of the inner portion is higher than an uppermost surface of the channel region.

9. The integrated circuit device of claim 7, wherein a lower portion of the inner portion protrudes into the source/drain region such that a lowermost surface of the inner portion is lower than an uppermost surface of the fin.

10. The integrated circuit device of claim 7, wherein the inner portion covers an uppermost surface of the outer portion.

11. An integrated circuit device, comprising:
    a fin on a substrate;
    first and second gate structures on the fin, wherein sidewalls of the first and second gate structures define a recess therebetween:
    a source/drain region in the fin between the first and second gate structures; and
    a contact plug on the source/drain region and in the recess, the contact plug comprising an inner portion and an outer portion, wherein:
    the outer portion comprises a metal;
    the inner portion comprises a semiconductor material;
    the outer portion at least partially covers a sidewall of the inner portion; and
    a portion of the outer portion is disposed between the sidewall of the first gate structure and the sidewall of the inner portion.

12. The integrated circuit device of claim 11, wherein the outer portion covers an uppermost surface of the inner portion.

13. The integrated circuit device of claim 1, wherein:
the sidewall, of the inner portion comprises first opposing sidewalls of the inner portion that extend substantially parallel to the sidewall of the first gate structure; and
the outer portion covers the first opposing sidewalls of the inner portion.

14. The integrated circuit device of claim 13, wherein the outer portion covers a second sidewall of the inner portion disposed between the first opposing sidewalls of the inner portion.

15. The integrated circuit device of claim 1, wherein the outer portion surrounds the inner portion when viewed in a plan view.

16. The integrated circuit device of claim 1, wherein:
the first and second gate structures extend in a first direction; and
the inner portion has a length along the first direction greater than a width along a second direction that is substantially perpendicular to the first direction.

17. The integrated circuit device of claim 1, wherein:
the first and second gate structures have line shapes extending in a first direction;
the inner portion comprises a plurality of inner portions disposed between the first and second gate structures and spaced apart from each other along the first direction; and
the outer portion is disposed between sidewalls of two immediately adjacent ones of the plurality of inner portions.

18. The integrated circuit device of claim 17, wherein the outer portion extends in the first direction and covers sidewalls of at least two of the plurality of inner portions facing the sidewall of the first gate structure.

19. The integrated circuit device of claim 1, wherein:
the first and second gate structures have line shapes extending in a first direction;
the outer portion comprises a plurality of outer portions disposed between the first and second gate structures and spaced apart from each other along the first direction; and
the inner portion comprises a plurality of inner portions that are at least partially in the respective plurality of outer portions.

20. The integrated circuit device of claim 1, wherein:
one of the outer and inner portions comprises a semiconductor material; and
a distance between an uppermost surface of the fin and an uppermost surface of the one of the outer and inner portions is at least about 50% of a distance between the uppermost surface of the fin and an uppermost surface of the first gate structure.

* * * * *